(12) United States Patent
Yousif

(10) Patent No.: US 9,781,854 B1
(45) Date of Patent: *Oct. 3, 2017

(54) SECOND MODULAR MOUNT RACK FRAME

(71) Applicant: Gorgius L. Yousif, Chicago, IL (US)

(72) Inventor: Gorgius L. Yousif, Chicago, IL (US)

( * ) Notice: Subject to any disclaimer, the term of this patent is extended or adjusted under 35 U.S.C. 154(b) by 50 days.

This patent is subject to a terminal disclaimer.

(21) Appl. No.: 14/745,644

(22) Filed: Jun. 22, 2015

Related U.S. Application Data

(63) Continuation of application No. 12/387,029, filed on Apr. 27, 2009, now abandoned, which is a continuation-in-part of application No. 11/364,495, filed on Feb. 28, 2006, now abandoned.

(51) Int. Cl.
*H05K 7/14* (2006.01)
*A47B 47/02* (2006.01)
*A47B 57/44* (2006.01)
*A47B 47/00* (2006.01)

(52) U.S. Cl.
CPC ........... *H05K 7/14* (2013.01); *A47B 47/0091* (2013.01); *A47B 47/027* (2013.01); *A47B 57/44* (2013.01)

(58) Field of Classification Search
CPC ........ H02B 1/012; H02B 1/013; H02B 1/308; H05K 7/183; H05K 7/186
USPC ..... 211/175, 194, 26, 126.15, 189–192, 117, 211/118, 200, 204, 206; 312/223.1, 312/265.1–265.4, 334.4, 334.5, 111; 361/724–727, 829; 248/460; 220/4.02, 220/4.03, 8; 206/503
See application file for complete search history.

(56) References Cited

U.S. PATENT DOCUMENTS

| | | | | |
|---|---|---|---|---|
| 3,563,624 A | * | 2/1971 | Stice | A47B 47/042 312/107 |
| 3,722,971 A | * | 3/1973 | Zeischegg | A47B 47/042 312/107 |
| 4,497,411 A | * | 2/1985 | DeBortoli | H05K 7/186 211/189 |
| 4,664,265 A | * | 5/1987 | George, Jr. | B25H 3/04 206/707 |
| 4,715,502 A | * | 12/1987 | Salmon | H04Q 1/09 211/175 |
| 6,238,029 B1 | * | 5/2001 | Marzec | H02B 1/30 211/26 |
| 6,481,582 B1 | * | 11/2002 | Rinderer | H05K 7/183 211/26 |
| 6,520,345 B1 | * | 2/2003 | Marovic | H02B 1/34 211/183 |
| 2003/0196980 A1 | * | 10/2003 | Ahn | A47F 5/137 211/189 |

* cited by examiner

*Primary Examiner* — Joshua Rodden
(74) *Attorney, Agent, or Firm* — Adrienne B. Naumann

(57) ABSTRACT

A second modular mount rack frame for storing devices is described herein. One mount rack frame can comprise two modular rigid support structures in which bolts reversibly insert to laterally increase or decrease the horizontal dimension available for a computer related device. Rigid modular support structures stack, align vertically, and mechanically attach to each other to increase storage in a vertical dimension. A second modular mount rack frame can also exhibit wheels or coasters so the entire frame can smoothly and easily move across a flat supporting surface.

25 Claims, 11 Drawing Sheets

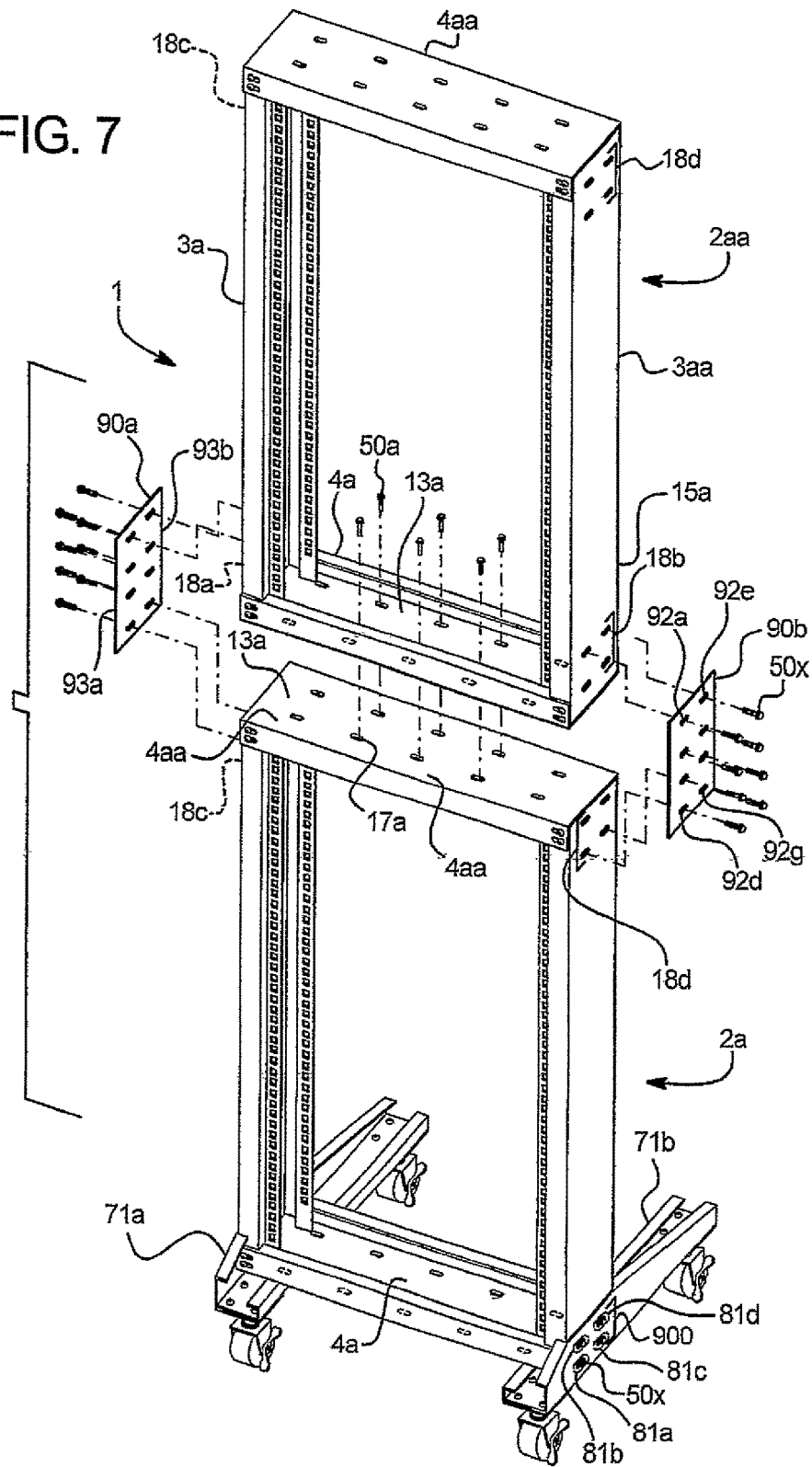

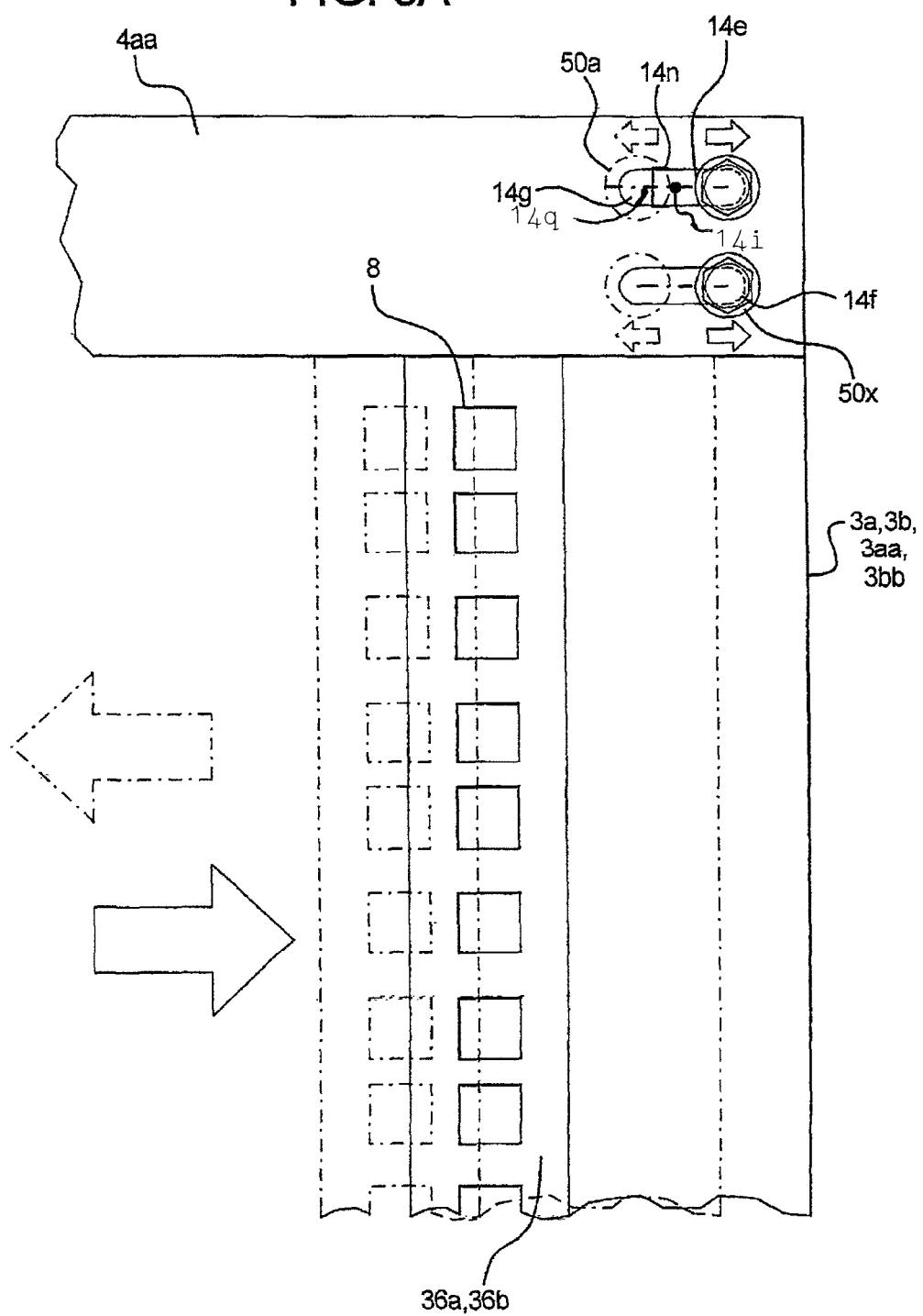

SECOND MODULAR MOUNT RACK FRAME

This application is a continuation in part of pending U.S. utility patent application Ser. No. 13/387,029 filed Apr. 27, 2009, and which is a continuation in part of U.S. utility patent application Ser. No. 11/364,495 filed Feb. 28, 2006 and now abandoned.

BACKGROUND OF THE INVENTION

This invention relates to a second modular mount rack frame for storing computer related devices such as hubs, switches, routers and servers. More particularly this invention relates to a second modular mount rack frame with detachable rigid modular support structures. This second modular mount rack frame also contains connecting plates for vertical attachments, lateral adjustment components and vertically attachment of two individual modular rigid support structures. Furthermore, there are connecting brackets which attach to both mounted devices and modular rigid support structures, thereby effectively stacking them vertically within the frame.

The prior art discloses cabinets for storage of computer related device which are expensive and cumbersome. They also require humidity and temperature controls because of their non-ventilated interior environment. Prior art storage structures also lack flexibility for adjusting the horizontal dimension of the mount rack frame whenever devices deviate from standard horizontal dimensions. Furthermore, because these prior art storage structures are not modular; they cannot stack vertically upon each other in an interchangeable manner. Prior art storage structures also do not exhibit reversibly attached rack bases by which the mount rack frame moves across a flat horizontal surface such as a floor.

The second mount rack frame solves these problems in an economical manner and contains the advantages of the mount rack frame previously described in U.S. utility patent application Ser. No. 11/364,495. With partially elliptical apertures and appropriate mechanical fasteners, the horizontal dimension within a standard mount rack frame is easily manually adjustable. If mobility is desired, each mount rack frame reversibly attaches to a rack base which includes wheels or coasters.

The current mount rack frame comprises numerous prototypes with dimensions which conform to standardized measurements (as well as multiples thereof) of the computer device industry. Because the mount rack frame is modular, additional rigid modular support structures vertically stack upon posterior or first anterior rigid modular support structures for increased storage.

Our second mount rack frame accommodates servers as well as hubs, switches, routers which were the subject of U.S. application Ser. No. 11/364,495. This improved second modular mount rack frame comprises larger wider frame components for easier assembly. Second mount rack frame also implements thick bolts with matching self-locking inserted hex nuts. As in the prototypes in U.S. application Ser. No. 11/364,495, modular rigid support structures stack upon each other vertically for additional storage.

My second mount rack frame has up to two sets of rigid vertically aligned components which are spaced to create to two parallel modular units with parallel horizontal rigid components. The anterior modular support unit is taller than the posterior modular unit, although both are anchored to two corresponding straight base supports.

With this new structure the second mount rack frame performs two important functions: It connects at two opposing anterior points along a server or hub for support solely by two opposing vertical rigid support components. The second mount frame also connects at four points—two anterior and two posterior—along larger devices such as servers. The four vertically aligned rigid components model can also be vertically enlarged by adding interchangeable modular rigid support structures.

None of the above described prior art prototypes posses the capability for (i) reversible and interchangeable four opposing point and two opposing point support of computer related devices by (ii) the reversible removal of a posterior modular rigid support structure; and thereby (iii) reducing the mount rack frame to one anterior modular rigid support structure for lighter devices.

SUMMARY OF THE INVENTION

The second mount rack frame disclosed and claimed herein comprises at least one modular rigid support structure, but this frame can contain a maximum of at least four modular rigid support structures. Each modular rigid support structure contains at least two rigid interchangeable vertical components and two rigid interchangeable horizontal components, and all of which are assembled to each other within a very short time period. Each rigid horizontal component and rigid vertical component also contains partially elliptical apertures and bolts or screws. These apertures congruently align for horizontal adjustment of rigid vertical components, as well as for mechanical attachment to other rigid components.

The second mount rack frame preferably contains at least two modular rigid support structures. In this preferred model there is a total of four rigid vertical support components, and each modular rigid support structure is easily assembled from interchangeable rigid components. When the second mount rack frame comprises four vertical rigid components, then the second mount rack frame can support servers which range to 40 inches in depth (using 25 inch universal brackets). Each modular rigid support structure can vertically align and stack upon another rigid modular support structure for additional device support and storage, and without additional floor space.

For all anterior and posterior modular rigid support structures, partially elliptical apertures containing bolts or screws are spaced along the rigid vertical and rigid horizontal components in aperture pairs. Partially elliptical apertures contain a centrally positioned screw or bolt with a lateral clearance on either side of that screw of preferably and approximately $1/16$ inch. As a result certain screws within specific partially elliptical apertures can move laterally, and this lateral movement results in an adjustable horizontal length between two opposing rigid vertical components within one modular rigid support structure. Bolts and screws within partially elliptical apertures also attach vertical rigid components to horizontal rigid components.

Other congruently aligning apertures have different functions. For example, rigid horizontal components contain smaller partially elliptical apertures for vertically attaching two modular rigid support structures to each other. Round threaded apertures within rack base legs attach rack base or straight base legs to a single rigid support structure or two module mount rack frame. Partially elliptical apertures within rigid vertical components attach (i) support plates with mechanical fasteners to stacked rigid support structures; and/or (ii) rack base legs to vertical rigid components.

Each modular rigid support structure has a horizontal length and vertical height of one 'U,' or a multiple thereof. A U is the unit of measurement in the computer industry, and each U designates a horizontal width of nineteen and a perpendicular height of one and three-quarters inches (for either an attached device or the actual mount rack frame). A second U standard designates a horizontal length of twenty-four inches, but the nineteen inch standard is more ubiquitous. Width (depth) of an attached device can vary and still remain within one U (or multiples thereof).

For example, a standard industry measurement of 3 U is equivalent to: (i) 57 inches in horizontal length of an attached device (or the modular rigid support structure), and (ii) 1.75×3 inches in height of the attached device (or vertical height interval along each rigid vertical component). Devices attach within each rigid support structure by vertically and linearly aligned apertures and inserted screws along rigid vertical components. There are also two sets of vertically aligned rack apertures along each rigid vertical component. As a result, the user can either attach the device more anterior or posterior along a modular rigid support structure.

In addition, each rigid vertical component end comprises apertures into which bolts or screws reversibly insert to attach a straight base leg or two rack base legs. Each straight base leg or rack base leg containing coasters or wheels with locking mechanisms. These coasters or wheels provide mobility to the mount rack frame or single modular rigid support structure.

Each rigid horizontal component is interchangeable structurally and functionally with all other rigid horizontal components of the same length and width. Consequently any rigid horizontal component can function as an upper horizontal component or a lower horizontal component of a modular rigid support structure with respect to a supporting flat surface such as a floor. Each rigid horizontal component end contains partially elliptical apertures for (i) attaching a connecting plate to a two-module mount rack frame, or (ii) reversibly attaching a rack base to a rigid support structure.

To increase the storage capacity of the new mount rack frame, one modular rigid support structure is stacked and aligned vertically upon the other. Since each modular rigid support structure is identical in structure and function to the other, all rigid support structures function either as the bottom or upper (stacked) modular unit. Rigid flat connecting plates, as well as additional bolts or screws, along the corresponding rigid horizontal components reversibly attach an upper aligned rigid support structure upon the supporting lower modular rigid support structure.

The anterior modular rigid support structure of the second mount rack frame is preferably taller than the posterior rigid support structure, but they are of the same horizontal dimension. In other embodiments the posterior rigid support structure may be taller than the anterior modular rigid support structure, as anterior and posterior positions along straight base legs are reversible and interchangeable.

The anterior modular rigid support structure in combination with posterior modular rigid support structure is designed for attachment of computer-related devices which require four point anterior/posterior attachment for adequate support. In this particular application, two anterior opposing points along opposing sides a computer related device attach to a first anterior modular rigid support structure. Simultaneously two posterior opposing points along opposing posterior sides of the same computer related device attach to the posterior modular rigid support structure.

Preferably both anterior and posterior rigid modular support structures are parallel to each other and attach to a first and second corresponding straight base legs to form a square or rectangle. For other embodiments, the reversibly attached first posterior modular rigid support structure is easily removed from the first anterior modular rigid support structure. When so removed, the posterior modular rigid support structure becomes the smaller lightweight and less cumbersome unit which accommodates smaller computer related devices as well as smaller budgets.

Accordingly, it is a purpose of the present invention to provide an economical manner in which to store computer-related devices, both heavy and lightweight, without the use of shelves.

It is also a goal of the present invention to provide an economical manner in which to store computer-related devices mounted to a mount frame rack at two and/or four points of attachment.

It is also a goal of the present invention to provide reversibly attached modular rigid support structures for computer related devices.

It is also a goal for the present invention to provide base legs with coasters or wheels which attach to modular rigid support structures.

It is another goal of the present invention to provide a device for adjusting the horizontal length of a modular rigid support structure and a mount rack frame.

It is another goal of the present invention to provide mechanical attachments by which a modular rigid support structure is vertically aligned upon another modular rigid support structure.

It is another goal of the present invention to provide modular rigid support structures which are structurally and functionally interchangeable with respect to vertical stacked alignment and attachment to a rack base leg or a straight base leg.

These features, as well as other improvements of the present invention, are apparent after review of the attached figures and DETAILED DESCRIPTION OF THE PREFERRED EMBODIMENT, BEST MODE AND OTHER EMBODIMENTS.

BRIEF DESCRIPTION OF THE DRAWINGS

FIG. 7 is an exploded view of second posterior modular rigid support structure in an upper aligned position upon first posterior modular rigid support structure.

FIG. 8A is an isolated closeup schematic anterior view of the lateral movement of bolts within partially elliptical apertures.

DETAILED DESCRIPTION OF THE PREFERRED EMBODIMENT, BEST MODE AND OTHER EMBODIMENTS

Preferred Embodiment

Figure 1:
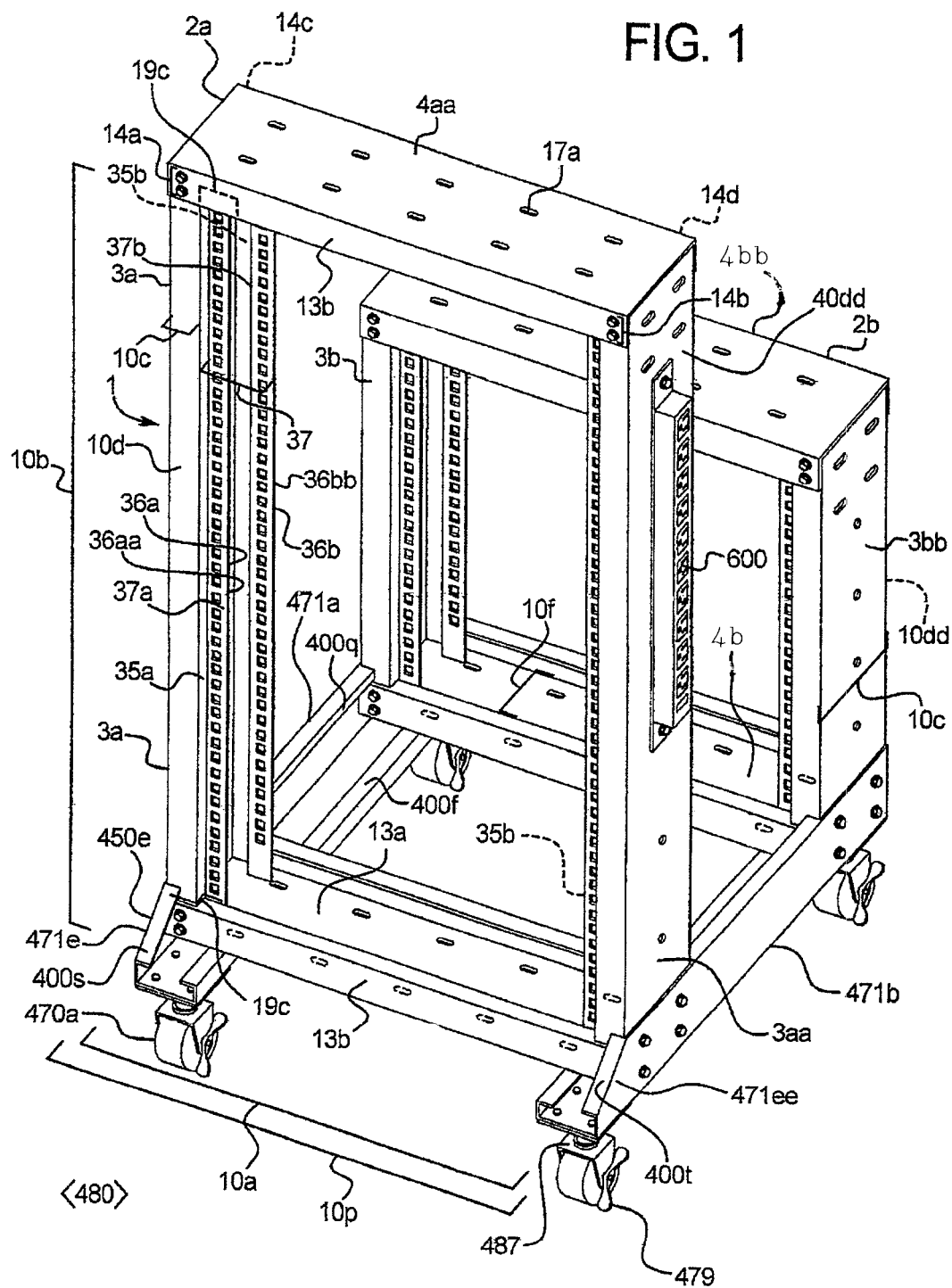
FIG. 1 is a partial anterior view of the preferred embodiment of the second mount rack frame.

Referring initially to FIG. 1 of the preferred embodiment, second modular mount rack frame 1 comprises a first anterior modular rigid support structure 2a and a first posterior modular rigid support structure 2b (generally modular rigid support structures 2). Second modular mount rack frame 1 rests upon a flat horizontal surface 480 such as a floor. First anterior rigid support structure 2a and first posterior rigid support structure 2b differ in vertical height 10b, but have the same depth 10c. All modular rigid support structures 2 are identical in structure and design to each other with U sizes ranging from 12 through 40.

Referring again to FIG. 1, first anterior modular rigid support structure 2a is greater in vertical height 10b than posterior modular rigid support structure 2b. However, first anterior modular rigid support structure 2a has the identical effective horizontal dimension 10a as first posterior modular rigid support structure 2b, and all modular rigid support structures 2 in other embodiments. Effective horizontal dimension 10a is approximately nineteen inches.

Each first anterior modular rigid support structure 2a or first posterior modular rigid support structure 2b can support (i) mounted devices 78 and (ii) at least one additional vertically stacked rigid support structure 2aa, 2bb or other modular rigid support structure 2.

The discussion below addresses a first anterior modular rigid support structure 2a within the preferred embodiment. However, the components, design and structure of first posterior and anterior modular support structures 2a, 2b are identical. The components, design and structure of other modular rigid support structures 2 in other embodiments is also identical to modular support structure 2a. The vertical dimension 10b and depth 10c of modular rigid support structures 2 may vary in other embodiments, although (i) effective horizontal length 10a of each modular rigid support structure 2 is always approximately nineteen inches, and (ii) total horizontal length 10p is always approximately twenty-three inches.

Modular Rigid Support Structures 2

Figure 2:
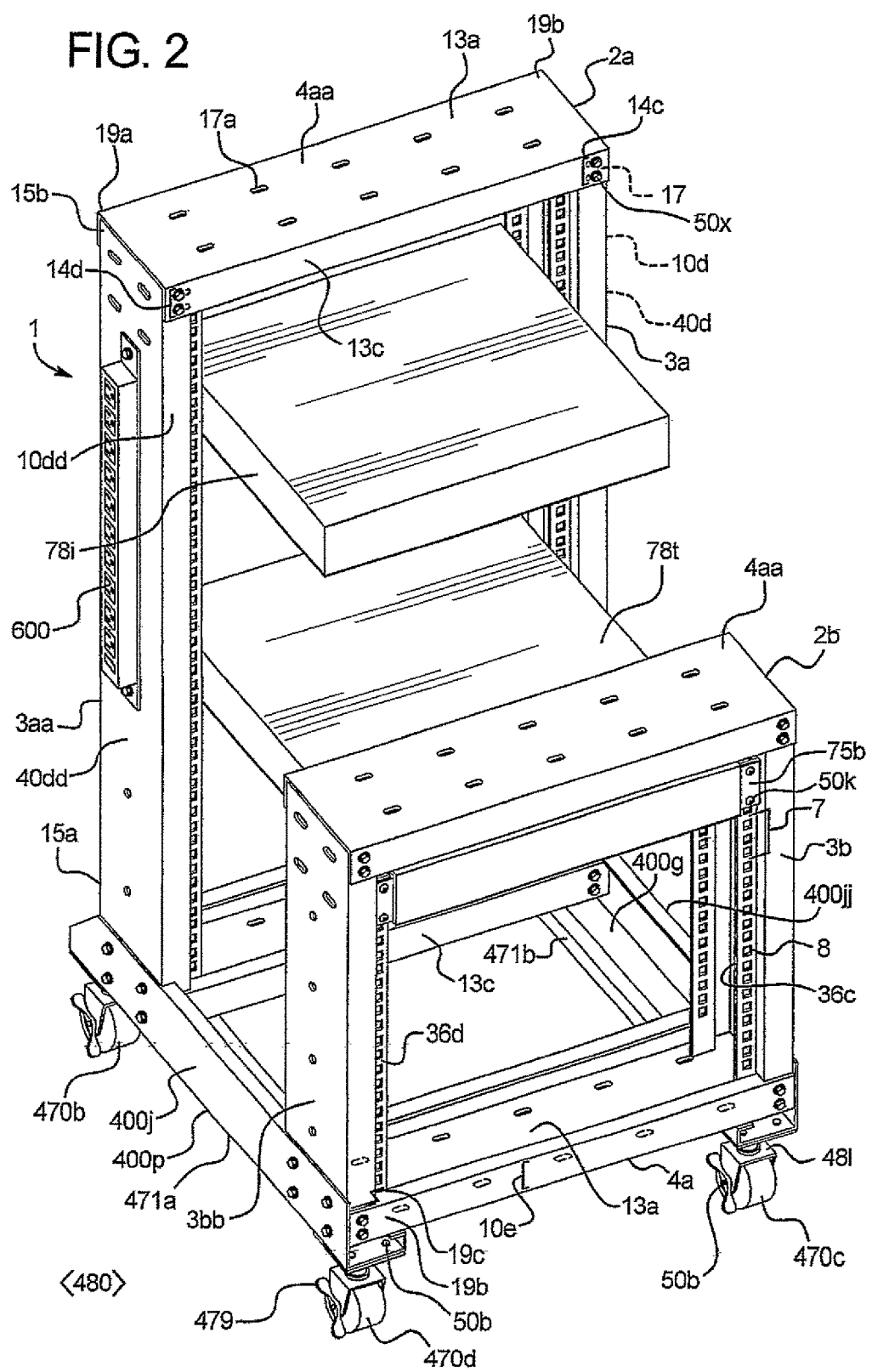
FIG. 2 is a partial posterior view of the second mount rack frame of FIG. 1.

Referring to FIGS. 1 and 2 of the preferred embodiment, first anterior modular rigid support structure 2a comprises first rigid vertical component 3a and second rigid vertical component 3aa [generally rigid vertical components 3]. Rigid vertical components 3a, 3aa directly oppose each other at a 180 degree angle in an assembled rigid modular support structure 2a, 2b, or any other modular rigid support structures 2.

Vertical longitudinal height 10b of each vertical rigid component 3a, 3aa is approximately 49 inches. Each rigid vertical component 3a, 3aa has an anterior vertical width side 10d and a posterior vertical width side 10dd of preferably approximately two inches. Each vertical rigid component 3a, 3b has a first and second lateral vertical side 40d, 40dd respectively, and each lateral vertical side has depth 10c of approximately four and one-eighth inches. For first posterior modular rigid support structure 2b, vertical height 10b of each first and second vertical rigid components 3b, 3bb is approximately thirty-nine inches. When assembled into modular rigid support structure 2 each rigid vertical support structure is perpendicular to flat support surface 480 and horizontal components 4.

Each lateral vertical component side 40d, 40dd is perpendicular to, and integrally attached, to anterior or posterior rigid vertical component surfaces 10d, 10dd respectively. Each anterior width side 10d and posterior width sides 10dd comprise the same posterior side/anterior side/lateral side dimensions. Preferably each first rigid vertical component 3a is the same vertical height as second rigid vertical component 3aa within one assembled anterior rigid modular support structure 2a. The same relationship is preferred for posterior vertical components 3b, 3bb or other embodiments.

Figure 3:
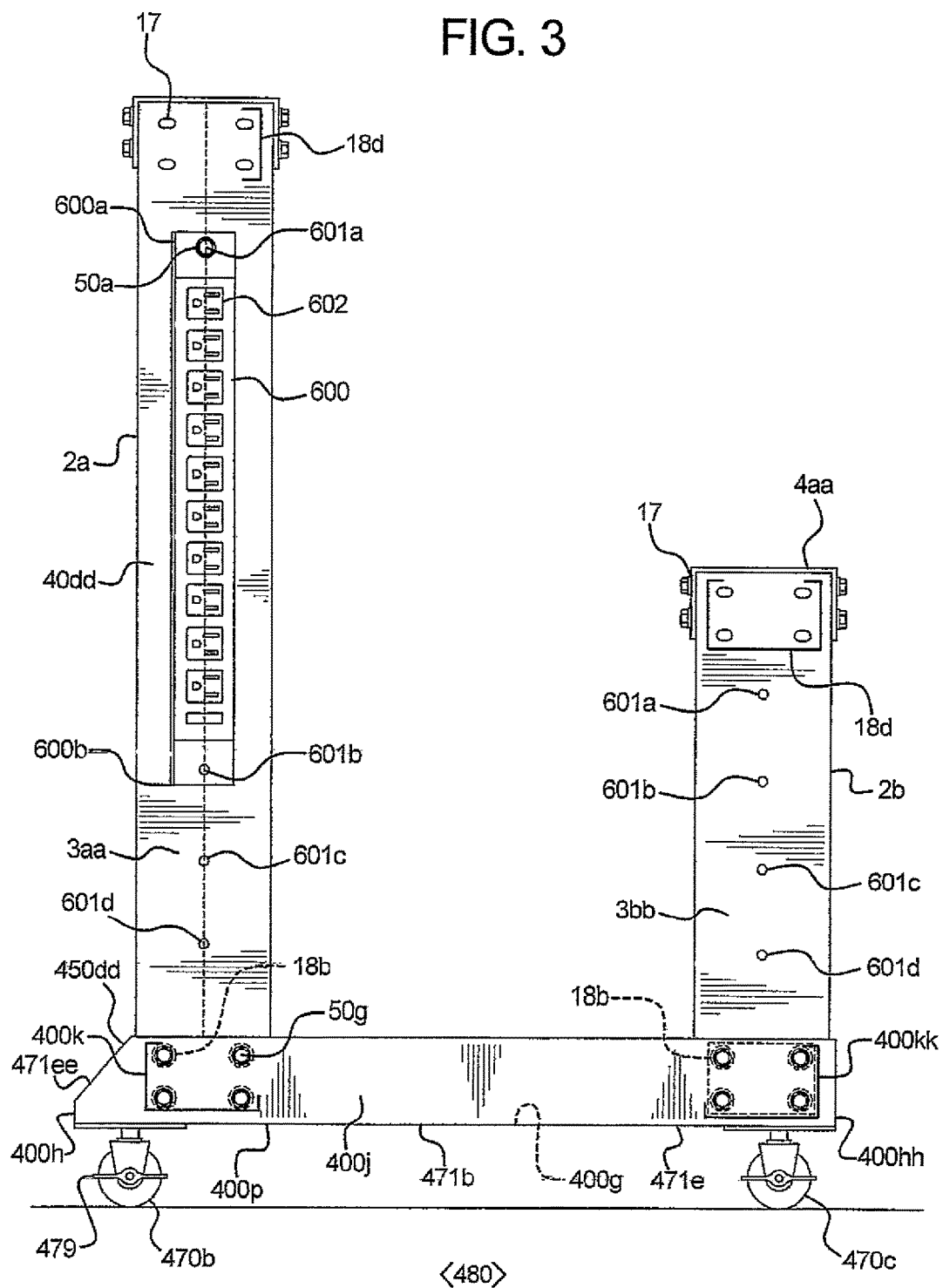
FIG. 3 is a lateral view of the second mount rack frame of FIG. 1.
Figure 4:
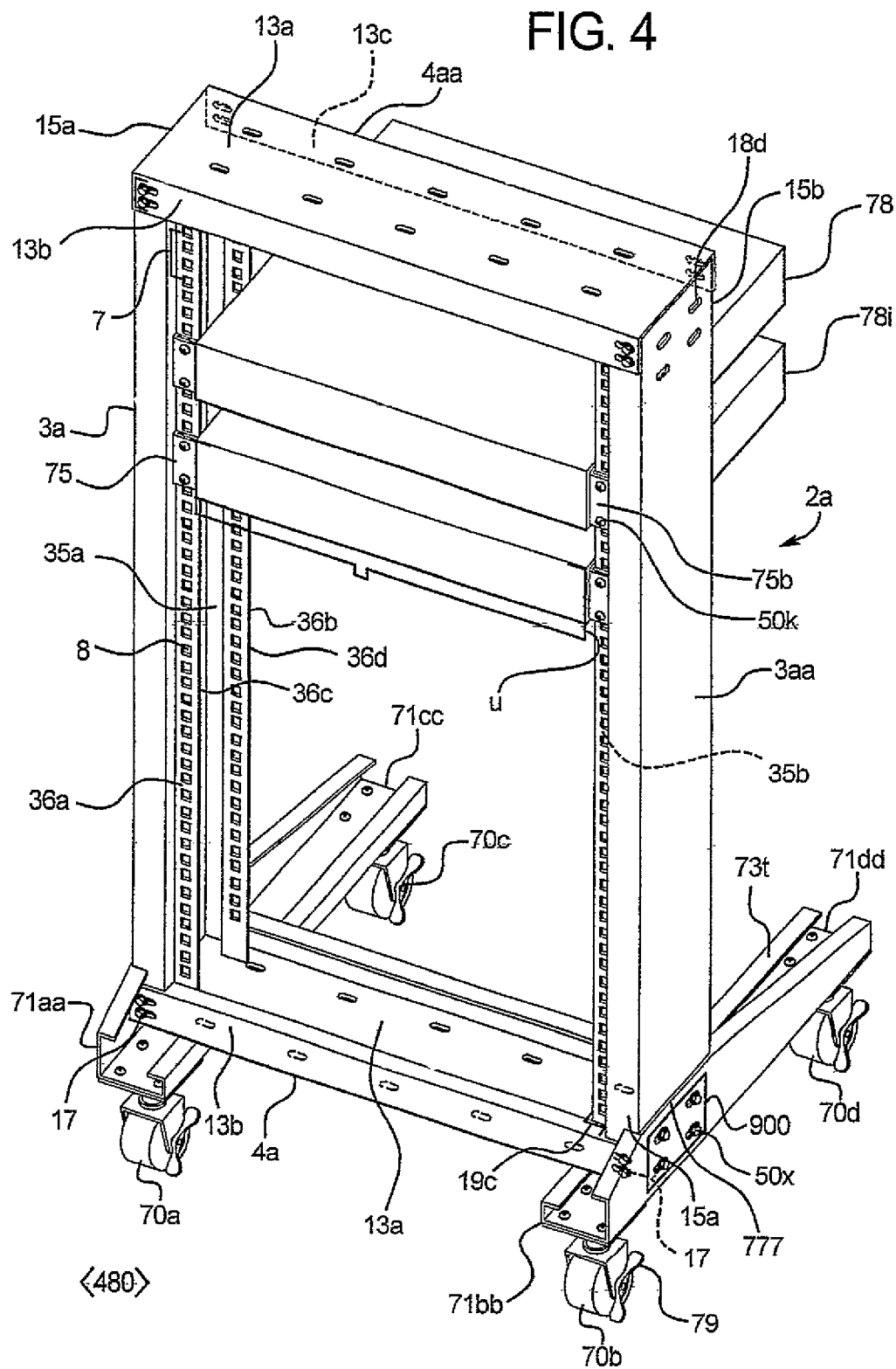
FIG. 4 is a partial anterior view of another embodiment of the second mount support rack with mounted devices.

Referring to FIG. 3 of the preferred embodiment, each lateral vertical side 40d, 40dd contains four round penetrating apertures 601a, 601b, 601c, 601d [generically round penetrating apertures 601]. Round penetrating apertures 601 linearly and vertically align with each other along lateral vertical side 40d or 40dd. Referring to FIGS. 1 and 4, each rigid vertical component 3a, 3aa, 3b, 3bb comprises first and second vertical interior surfaces 35a, 35b respectively. Each vertical interior surface 35a, 35b is approximately three-quarters inch in width.

Preferably first anterior vertical rigid components 3a, 3aa are interchangeable with each other, while first posterior vertical rigid components 3b, 3bb are interchangeable with each other (assuming components 3a, 3aa, or 3b, 3bb exhibit identical width and depth). Vertical rigid components 3a, 3aa may not be interchangeable with components 3b, 3bb, if corresponding widths and depths diverge.

Vertical rigid components 3a, 3aa, 3b, 3bb within their corresponding modular rigid support structures 2a, 2b respectively are aligned in a fixed, yet reversible mechanical manner. Each vertical rigid component 3a, 3aa, 3b, 3bb is positioned perpendicular to a flat supporting surface 480 as well as to (i) attaching straight base legs 471a, 471b; or (ii) attaching rack base legs 71a, 71b infra.

b. Rigid Horizontal Components 4a, 4aa,

Referring to FIGS. 1 and 2 of the preferred embodiment, first anterior modular rigid support structure 2a also comprises first rigid horizontal component 4a and second rigid horizontal component 4aa. Rigid horizontal components 4a, 4aa are parallel to each other within assembled rigid modular support structure 2a, 2b, or other modular support structure 2. Rigid horizontal comments 4a, 4aa, or other embodiments of 4 are also parallel to the flat supporting surface 480 when assembled within rigid modular support structure 2a, 2b or other modular rigid support structure 2.

Referring to FIG. 1, each first and second anterior rigid horizontal component 4a, 4aa respectively, as well as each anterior first and second posterior rigid horizontal component 4b, 4bb respectively, is approximately twenty-three inches in total length 10aa. The effective lateral horizontal length 10a is nineteen inches, because nineteen inches is the industry standard lateral horizontal length 10a to accommodate a single U mounted device 78. Each rigid horizontal component 4a, 4aa, or 4b, 4bb is approximately four and seven-eighths inches in horizontal width 10f.

First and second anterior rigid horizontal components 4a, 4aa respectively are parallel to each other when assembled into first anterior modular rigid support structure 2a. Similarly, first and second posterior rigid horizontal components 4b, 4bb respectively are parallel to teach other when assembled into first posterior modular rigid support structure 2b. Each first and second horizontal rigid component 4a, 4aa, 4b, 4bb respectively is structurally and functionally interchangeable with the other.

Referring to FIGS. 1 and 2, at each horizontal rigid component end 19a, 19b is cut away section 19c. One rigid vertical component end 15a or 15b inserts within a corresponding cutaway section 19c. Each rigid horizontal component 4a, 4aa, 4b, 4bb also comprises a corresponding horizontal bottom side 13a. Horizontal bottom side 13a integrally and continuously attaches perpendicular to first downward side 13b and second downward side 13c. Each downward first and second downward side 13b, 13c respectively is approximately two inches in downward width 10e.

Horizontal side 13a and downward sides 13b, 13c are preferably approximately one-1/16 to 3/32 inch in thickness. Rigid vertical component ends 15a, 15b insert and slide in a limited manner along horizontal bottommost side 13a within corresponding cutaway section 19c. Each rigid vertical component 3a, 3aa of first anterior modular rigid support structure 2a is reversibly removable from anterior horizontal rigid components 4a, 4aa. Similarly, each rigid vertical component 3b, 3bb of first posterior modular rigid support structure 2b is reversibly removable from posterior horizontal rigid components 4b, 4bb respectively. In other embodiments rigid vertical components 3 are reversibly removable from corresponding horizontal rigid components 4.

Anterior first and second rigid vertical components 3a, 3aa respectively are parallel to each other when assembled within first anterior modular rigid support structure 2a. Anterior first and second rigid horizontal components 4a, 4aa respectively are parallel to each other and attach at a right angle to vertical rigid components 3a, 3aa respectively when assembled as first modular rigid support structure 2a. Components 3a, 3aa, 4a, 4aa thereby form a rectangle or square within one plane, as do components 3b, 3bb, 4b, 4bb in a posterior rigid modular support structure 2b, or other embodiment of rigid modular support structures 2 with components 3, 4. Other four-sided polygons and other two-dimensional shapes are also within the scope of the invention.

b. Partially Elliptical Apertures 17,17a

Figure 5A:
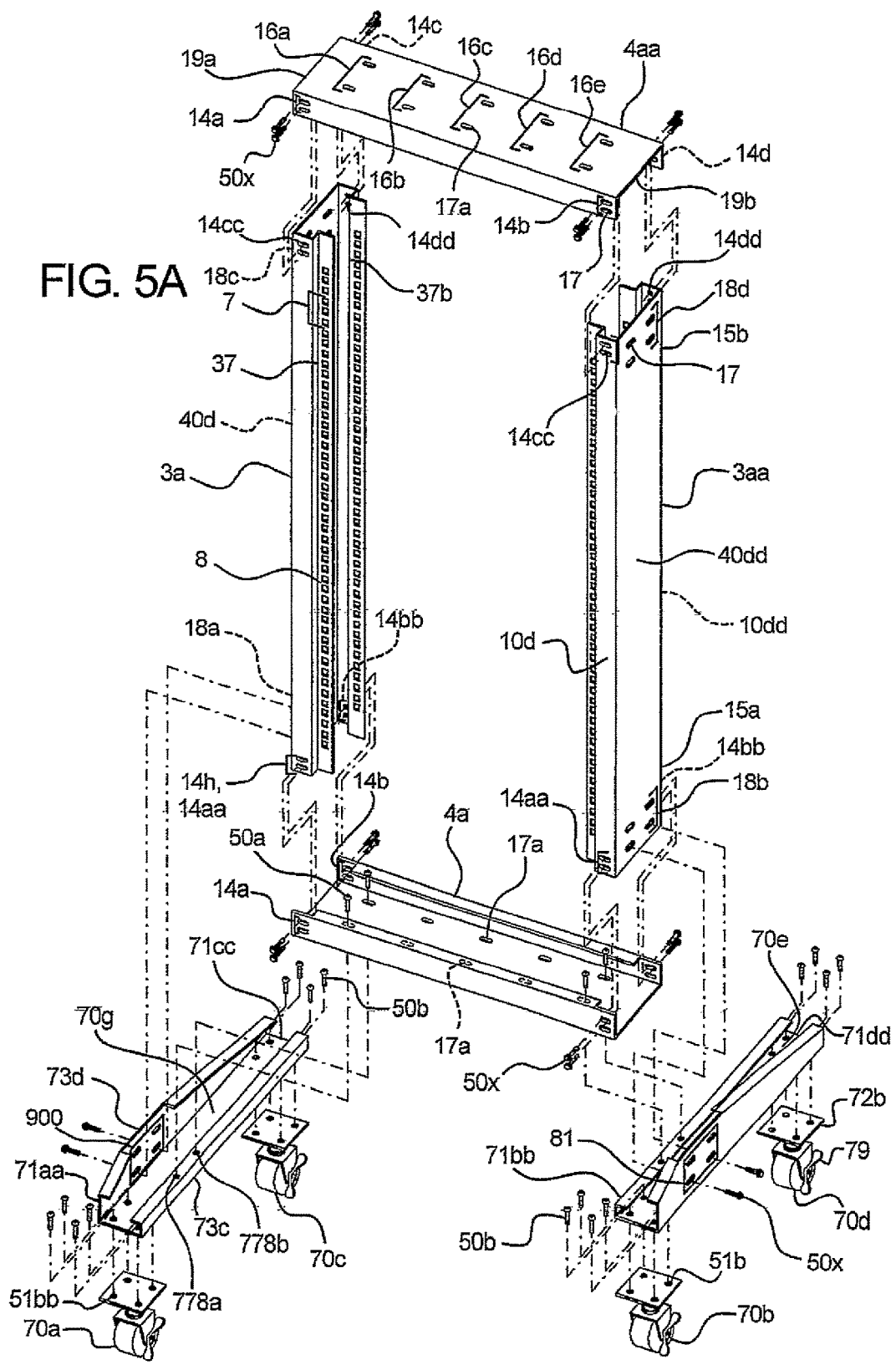
FIG. 5A is an exploded view of an anterior modular rigid support structure and rack base legs.
Figure 5B:
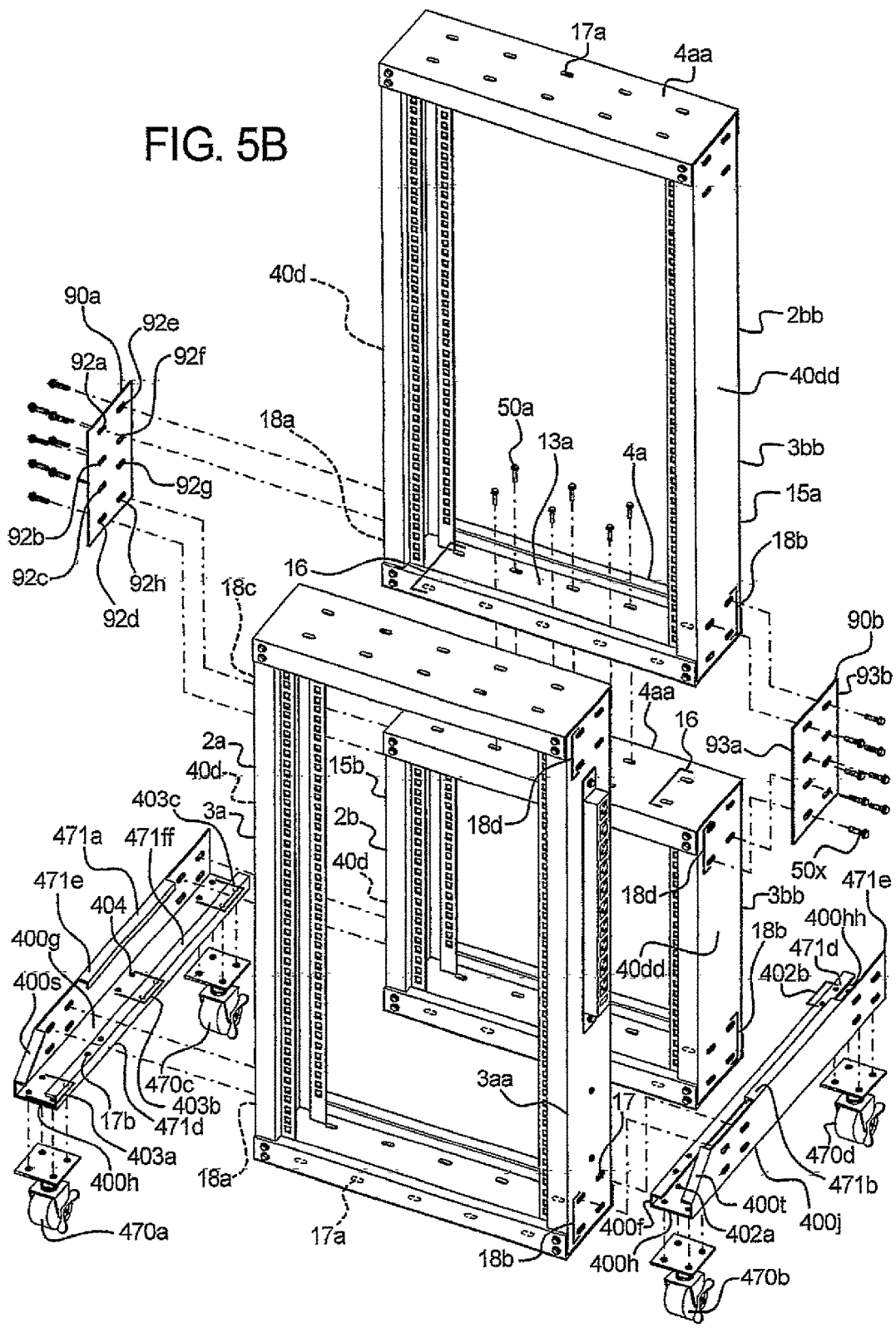
FIG. 5B is an exploded view of the second mount rack frame with an additional vertically aligned modular rigid support structure.
Figure 5C:
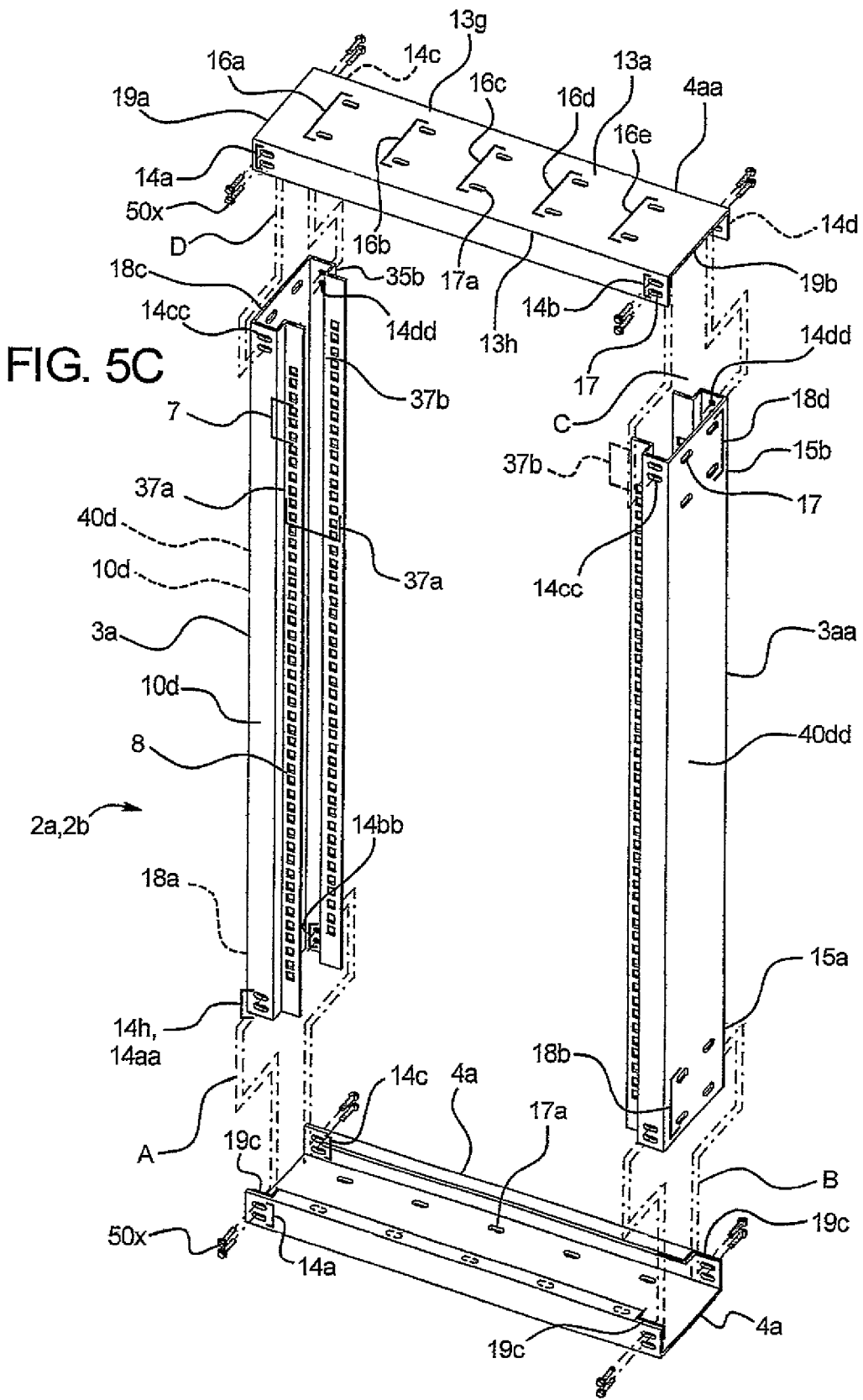
FIG. 5C is an exploded view of the preferred modular rigid support structure.

Referring to FIG. 5C, each rigid vertical component 3a, 3aa, or 3b, 3bb contains vertically aligned aperture pairs 14aa, 14bb, 14cc, 14dd (generically vertical pairs 14h) of large partially elliptical apertures 17. Vertical aperture pairs 14h are located within first and second vertical components end 15a, 15b along vertical sides 10d, and 10dd.

As best seen in FIG. 8A, in the preferred embodiment each large partially elliptical aperture 17 within aperture pairs 14h has an aperture longitudinal axis 14e perpendicular to vertical height 10b of corresponding rigid vertical component 3a, 3b. Each large partially elliptical aperture 17 comprises midpoint 14i along aperture long axis 14e. Each large partially elliptical aperture 17 within vertical pair 14h is preferably approximately seven-sixteenths inch in aperture long axis longitudinal length 14q, and one-quarter inch in aperture height 14n. However, other aperture shapes and dimensions are also within the scope of the invention. Each large partially elliptical aperture 17 also has an aperture midpoint 14i and an aperture height 14n.

Each large partially elliptical aperture 17 provides a lateral clearance of 1/16 inch on each side of an inserted bolt 50x. Each large partial elliptical aperture 17 is designed to reversibly receive one threaded bolt 50x. Threaded bolt 50x preferably has a maximum hexagonal head dimension of five-eighths inch, a threaded stem with mated hex nut (not seen) and a washer (not seen). Threaded stem is approximately one-quarter inch in diameter and three-quarters inch in length.

There is a maximum lateral clearance of approximately 1/16-inch on each side of a centrally positioned threaded bolt 50x along aperture long axis 14e. There is also a maximum lateral clearance of approximately 1/16 inch on each side of a centrally positioned large round threaded screw 50a within smaller partially elliptical aperture 17a, or in other embodiments. Preferably large round threaded screw 50a has a diameter of approximately one-half inch and a stem diameter of approximately three-sixteenths inch. and includes a circular washer (not seen).

Vertical aperture pairs 14h (4aa, 14bb, 14cc, 14dd) are positioned at rigid vertical component ends 15a, 15b within corresponding first and second rigid vertical component anterior and posterior vertical sides 10c, 10d respectively. Two partially elliptical apertures 17 within each pair 14h align directly above or below each other within corresponding anterior vertical side 10d or posterior vertical side 10dd.

Still referring to FIG. 5C, each rigid horizontal component 4a, 4aa, 4b, 4bb, or other rigid horizontal components 4 in other embodiments, comprises first, second, third and fourth horizontal aperture pairs 14a, 14b, 14c, 14d respectively (generically horizontal aperture pairs 14). Each horizontal aperture pair 14 is located at first and second horizontal component ends 19a, 19b respectively, within first and second horizontal downward sides 13b and 13c respectively. Each horizontal aperture pair 14 comprises two large partially elliptical apertures 17.

Each large partially elliptical aperture 17 within a horizontal pair 14a, 14b, 14c, 14d (generically horizontal pairs 14) is identical in shape and dimension to large partially elliptical apertures 17 within vertical pairs 14h. Each aperture long axis 14e within aperture pairs 14 is parallel to the effective longitudinal length 10a of its corresponding rigid horizontal component 4. Within an assembled modular rigid support structure 2a, 2b or other structures 2, each horizontal aperture pair 14 congruently aligns with corresponding vertical aperture pair 14h, i.e.: 14a, 14aa, 14b, 14bb, etc.

Still referring to FIG. 5C, in the preferred embodiment first, second, third, fourth and fifth horizontal pairs 16a, 16b, 16c, 16d, and 16e respectively (generically laterally aligned pairs 16) of smaller partially elliptical apertures 17a penetrate horizontal central side 13a. Each smaller partially elliptical aperture 17a is identical in design and shape to large partially elliptical aperture 17. Each smaller partially elliptical aperture 17a has an aperture midpoint 14i and an aperture height 14n. Each large partially elliptical aperture 17 also has an aperture longitudinal axis 14e perpendicular to longitudinal vertical height 10b of corresponding rigid vertical component 3a, 3b or 3.

Horizontally aligned pairs 16 are equidistantly spaced from each other and are parallel to each other. Other numbers of laterally aligned pairs 16 containing smaller partially elliptical apertures 17a are also within the scope of the invention. In other embodiments horizontally aligned pairs 16 and apertures 17a comprise diverse shapes and dimensions, as well as distances from each other.

Preferably adjoining laterally aligned pairs 16 each lie approximately (i) four inches from each other, and (ii) one and one-quarter inches from each first and second rigid horizontal component longitudinal edges 13h, 13g respectively (measured from the closest smaller partially elliptical aperture 17a to longitudinal edge 13h, 13g). Each laterally aligned pair 16 is parallel to, and linearly aligned with, remaining laterally aligned pairs 16 within horizontal central side 13a.

Referring now to FIG. 7, one large round screw 50a inserts within each corresponding smaller partially elliptical aperture 17a of laterally aligned pairs 16. There is a maximum lateral clearance of approximately 1/16-inch along aperture longitudinal axis 14e on each side of a centrally positioned large round screw 50a within smaller partially elliptical aperture 17a.

Referring again to FIG. 5C, in the preferred embodiment first and second square vertical aperture sets 18a,18b respectively (generically square vertical sets 18) each comprise four large partially elliptical apertures 17. Each large partially elliptical aperture longitudinal axis 14e is perpendicular to longitudinal vertical length 10b of corresponding rigid vertical component 3.

Each square vertical aperture set 18a, 18b is located within a rigid vertical component end 15a, 15b along a corresponding first or second lateral vertical component side 40d, 40dd. Within each square set 18, four large partially elliptical apertures 17 form a square within a corresponding lateral vertical component side 40d, 40dd. However, other numbers or shapes of large partially elliptical apertures 17 are also within the scope of the invention. One threaded bolt 50x inserts into two aligned elliptical apertures 17 whenever square set 18 congruently aligns with corresponding partially elliptical aperture 17a in other components.

Square sets 18a, 18b have three functions: (i) insertion points for threaded bolts 50x which attach flat rigid connector plates 90 to vertical rigid components 3 infra; (ii) attachment of anterior and posterior modular rigid support structures 2a, 2b respectively to first and second straight base legs 471a, 471b respectively; and (iii) attachment of first anterior and posterior second modular rigid support structures 2a, 2b respectively to first and second rack base legs 71a, 71b respectively.

c. Stamped Metal Strips 36a, 36b

Referring to FIG. 1 of the preferred embodiment, each rigid vertical component 3a, 3aa, 3b, 3bb, or other 3, comprises one stamped pair 37 of first and second stamped metal strips 36a, 36b respectively (generically stamped metal strips 36). Each first and second stamped metal strip 36a, 36b respectively integrally attaches to first and second interior vertical component surfaces 35a and 35b respectively.

First and second stamped metal strips 36a, 36b respectively are parallel to each other along longitudinal vertical length 10b of corresponding rigid vertical component 3a, 3aa, 3b, 3bb, 3. Stamped metal strips 36a, 36b are approximately three inches apart from each along their entire longitudinal vertical lengths 10b. First stamped metal strip 36a is approximately three-quarters inch from rigid vertical component edge 35a in an anterior/posterior direction. Similarly, second stamped metal strip 36b is approximately three-quarters inch from rigid vertical component edge 35b in an anterior/posterior direction.

Each stamped metal strip 36a, 36b is approximately 1/16 to 3/32 inch in thickness. First and second stamped interior edges 36c, 36d respectively integrally attach to corresponding first and second interior vertical component surfaces 35a, 35b respectively. Each stamped metal strip 36a, 36b protrudes from, and is perpendicular to, corresponding vertical segment surface 35a or 35b. Each vertical interior surface 35a, 35b is perpendicular to its corresponding crimped metal strip 36a, 36b which attaches thereto.

Still referring to FIG. 1, each first and second stamped metal strip 36a, 36b respectively also comprises a first or second exterior edge 36aa, 36bb respectively. Preferably stamped metal strips 36a, 36b are identical in design and structure. Preferably, stamped metal strips 36a, 36b are also interchangeable with respect to attachment to rigid vertical component 3a and 3aa, 3b, 3bb or 3 whenever rigid vertical components 3 are the same longitudinal vertical height 10b. However, vertical height, width and thickness of stamped metal strips 36 in other embodiments may differ.

Referring to FIG. 5C, each stamped pair 37a is parallel to and aligned with its opposing stamped pair 37b along its opposing rigid vertical component 3a, 3aa or 3b, 3bb within an assembled first anterior or first posterior modular rigid support structures 2a, 2b. Stamped metal strips 36a, 36b are also parallel to longitudinal length 10b of corresponding rigid vertical component 3a, 3aa or 3b, 3bb to which stamped metal strip 36a, 36b attaches.

Each first stamped metal strip 36a is approximately three and one-quarter inches anterior to second stamped metal strip 36b. Each stamped metal strip 36a, 36b is preferably identical in structure, design and function to the other. However, stamped metal strip vertical dimensions may vary in other embodiments.

In the preferred embodiment, each stamped metal strip 36a, 36b within first anterior modular rigid support structure 2a is approximately fifty-two inches in vertical longitudinal height 10b and approximately one inch in horizontal width. Each stamped metal strip 36a, 36b within first posterior modular rigid support structure 2b is preferably approximately thirty-nine inches in vertical longitudinal height and approximately one inch in horizontal width. Other vertical longitudinal lengths 10b of appropriate U size are satisfactory within additional embodiments.

Referring now to FIGS. 1 and 5C, within each first and second stamped metal strip 36a, 36b respectively are rack sets 7. Each rack set 7 comprises three linearly and vertically aligned rack apertures 8 proximal to corresponding first and second exterior stamped edge 36aa or 36bb respectively. Each rack aperture 8 is square and each of rack aperture's four sides is approximately three-eighths inch in length.

In the preferred embodiment there are twenty-eight aligned rack sets 7 within each stamped rack metal strip 36a, 36b of anterior rigid vertical components 3a, and 3aa. Also in the preferred embodiment, there are twenty-one aligned rack sets 7 within each stamped rack metal strip 36a, 36b of posterior rigid vertical components 3b, and 3bb.

Each aligned rack set 7 is approximately one and three-quarters inches in vertical height, for consistency with the international standard U vertical unit which is exactly one and three-quarters height. However, other numbers of racks sets 7 are also within the scope of the invention. Each centrally positioned rack aperture 8 is preferably approximately five-eighths inch from adjacent rack apertures 8 within its respective rack set 7. There is preferably approximately one-eighth inch vertically between consecutive rack sets 7.

d. Mounted Device 78 Attachment Structures

Mounted devices 78 mounted and stored upon second modular mount rack frame 1 are generally computer-related and include, although not exclusively: servers, hubs, switches and routers. Similarly to modular rigid support structures 2, mounted devices 78 are categorized within internationally designated U units. Mounted device 78 of one U unit is nineteen inches in anterior length and one and three-quarter inches in vertical height, although depth may vary.

Because the international standard height U is 1 and 3/4 inches, most manufacturers design their devices 78 and attaching brackets 75 accordingly. Each one U device 78 is approximately 1 and 11/16 inches in height. Consequently, when devices 78 are mounted upon a modular rigid support structure(s) 2, there is approximately 1/32 inch of vertical space between vertically aligned adjacent devices 78 within a modular rigid support structure 2.

As best seen in FIGS. 2 and 4, smaller lighter computer-related mounted devices 78*i* only require two anterior mechanical attachments to stamped metal strips 36*a*, 36*b* of two opposing rigid vertical components 3*a*, 3*aa* or 3*b*, 3*bb*. Opposing two anterior mechanical attachments are sufficient to support the weight of a hub, switch or router 78*i*.

Figure 6:
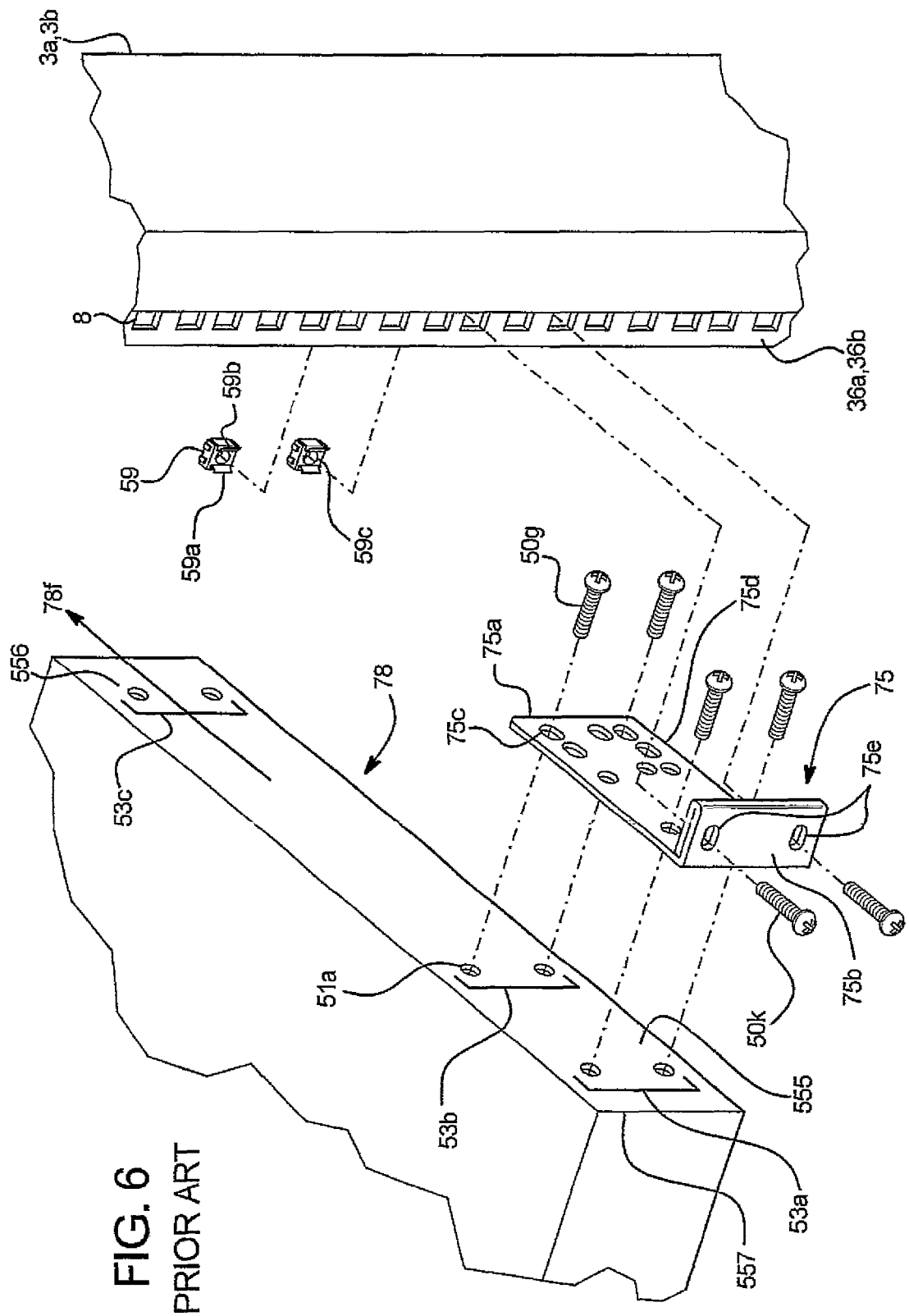
FIG. 6 is a close up isolated view of a prior art connecting bracket attaching to rack apertures and a mounted device.

Referring to FIG. 6, larger computer related devices 78*t* such as servers require: (i) two opposing points along each anterior device segment 555 of each opposing device side 78*a*, 78*b* respectively; and (ii) two opposing points along each first and second posterior segment portion 556 of each opposing device side 78*a*, 78*b* respectively.

In another embodiment, computer related devices 78*i* mount to a sole and only rigid modular support structure 2 within second modular mount rack frame 1. This embodiment requires that one modular rigid support structure 2*a*, 2*b*, or other modular rigid support structure 2, attach solely and exclusively to first and second rack base legs 71*a*, 71*b*. Also in this embodiment, there can only be two anterior attachments at anterior opposing segments 555 of a smaller computer related device 78*i*.

Referring to FIG. 6, prior art mounting bracket 75 reversibly attaches to mounted device 78*i* by countersink or bevel head screws 50*g*. Screws 50*g* are preferred because they fit flush along a bracket surface. However, other prior art mounting brackets 75, screws and mechanical attachments are satisfactory in other embodiments. Both anterior device side segments 555 of opposing device sides 78*a*, 78*b* extend posterior from anterior device edge 557 in an anterior-posterior dimension 78*f*.

First, second and third mounting aperture pairs 53*a*, 53*b*, 53*c* (generically mounting aperture pairs 53) each comprise vertically aligned mounting round apertures 51*a*. Each mounting aperture pair 53 linearly aligns with remaining pairs 53 along each opposing first and second device sides 78*a*, 78*b* (not seen in this view) in anterior/posterior direction 78*f*. Each mounting aperture pair 53 aligns parallel to posterior device edge 557. Each mounting aperture pair 53 reversibly receives one countersink or bevel head screw 50*g* within each mounting pair's corresponding mounting round aperture 51*a*.

There is approximately one to five inches between anterior mounting aperture pairs 53*a*, 53*b* and one to five inches between mounting aperture pairs 53*b* and 53*c*. Mounting pair 53*a* is approximately one to five inches from anterior edge 557, while mounting aperture pair 53*c* is approximately one to five inches from posterior device edge.

Still referring to FIG. 6, in the preferred embodiment each prior art mounting bracket 75 preferably comprises flat bracket end 75*a*, bracket flat segment 75*d*, and bent bracket end 75*b*. Flat bracket segment 75*d* comprises flat end apertures 75*c*, and each flat end aperture 75*c* can congruently align with a corresponding mounting round aperture 51*a*. Bent bracket end 75*b* is integrally part of, but perpendicular to bracket flat segment 75*d*. Bent bracket end 75*b* comprises bent bracket apertures 75*e*, through which preferably large round Phillips head or straight head screw 50*k* insert.

Prior art cage nut 59 comprises first and second opposing crimped flanges 59*a*, 59*b*, a square configuration and centrally positioned threaded round cage aperture 59*c*. Cage nut 59 is approximately ⅜ inch in length upon on each side. Cage nut 59 inserts within a single rack aperture 8 and is held therein by opposing protruding first and second cage flanges 59*a*, 59*b* respectively. One round straight head screw 50*k* inserts within each threaded round cage aperture 59*c* and congruently aligned bent rack apertures 75*e*, thereby connecting attaching stamped metal strip 36*a* or 36*b* to bent bracket end 75*b*.

To attach mounted device 78*i* at two anterior points to mounting bracket 75, one counter-sink or beveled head small round screw 50*g* inserts through (i) each of two mounting round apertures 51*a* of a pre-selected mounting aperture pair 53*a* or 53*b* to congruently align with;
(ii) each of one of two flat end apertures 75*c*;
(iii) for a total of two counter sink or beveled round head screws 50*g* attaching mounted device 78 to mounting bracket 75 (mounting bracket 75 in turn being connected to stamped metal strip 36*a*, 36*b* by bent bracket end 75*b*, screws 50*k* and cage nuts 59).

Please see FIGS. 4 and 6.

For the above described two point attachment, one anterior aperture pair 53*a* or 53*b* is selected, with that aperture pair 53*a*, 53*b* being the same opposing aperture pair on each opposing device side 78*a*, 78*b*. With four point attachment, opposing anterior two Point attachment is identical, with addition to two point attachments at aperture pair 53*c*. For posterior attachment at posterior aperture pairs 53*c*, brackets 75 and cage nuts 59 attach to device 78 and stamped metal strip 36*a*, 36*b* in a manner identical to two point attachment of anterior aperture pairs 53*a* or 53*b*. Please see FIGS. 2 and 6.

Power Strip 600

Referring to FIG. 3 of the preferred embodiment, prior art electrical power strip 600 facilitates operation of mounted device 78 (not seen in this view) without removal of devices 78 from second modular mount rack frame 1. Power strip 600 reversibly attaches to one rigid vertical component 3 with small round screws 50*a*.

Power strip 600 is preferably approximately nineteen inches in longitudinal length, one and three-quarters inches in width, and one and three-eight inch in depth. Power strip 600 preferably attaches to first or second lateral vertical component side 40*d*,40*dd* respectively by screws 50*a* and four round penetrating apertures 601*a*, 601*b*, 601*c*, 601*d* within each rigid vertical component 3. Small round penetrating apertures 601 are linearly and vertically aligned along longitudinal midline 602 of lateral vertical component side 40*d* or 40*dd*.

Within fully assembled preferred second modular mount rack frame 1, uppermost round penetrating aperture 601*a* is preferably approximately 47 inches from flat supporting surface 480. Second lower round penetrating aperture 601*b* is approximately 28.5 inches from supporting surface 480. Third lower round penetrating aperture 601*c* is approximately 24 inches from surface 480, while fourth lowest round penetrating aperture 601*d* is approximately six inches from supporting surface 480. Vertical distance of power strip 600 from flat supporting surface 480 along a corresponding vertical rigid component 3 is adjustable by inserting small round screws 50*a* into upper or lower small round penetrating apertures 601*a*, 601*b*, 601*c*, 601*d*.

As seen in FIG. 3, power strip 600 is parallel to, and immediately contacts and adjoins, rigid vertical component 3*aa* to which it mechanically attaches. Other positions of electrical power strip 600 are also within the scope of the invention. For example, power strip end 600*a* can attach to a rigid vertical component 3 at right angles to longitudinal vertical length 10*b*. In other embodiments power strip ends 600*a*, 600*b* attach to first and second opposing stamped metal strips 36*a*, 36*a*. In this last embodiment power strip 600 is parallel to assembled rigid horizontal components 4*a* (not seen in this view) and 4*aa*.

Base Legs a. Straight Base Legs 471*a*, 471*b*

Referring to FIGS. 1, 2, 3 and 5B second modular mount rack frame 1 preferably comprises a first straight base leg 471*a* and a second straight base leg 471*b*. Each straight base leg 471*a*, 471*b* is approximately (i) thirty inches in maximum longitudinal length along straight leg bottom edge 471*c*; and (ii) two and three-quarters inches in straight leg width. Each straight base leg 471*a*, 471*b* is made of flat metal which is approximately one-sixteenth inch in thickness.

Referring to FIGS. 1 and 2 of the preferred embodiment each first straight base leg 471*a* directly opposes second straight base leg 471*b* at a one hundred and eight degree angle. First straight base leg 471*a* lies in the same plane as second straight base leg 471*b* when assembled within second modular mount rack frame 1. First straight base leg 471*a* is also the same vertical distance above flat horizontal supporting surface 480 as is second straight base leg 471*b* when assembled as second modular mount rack frame 1.

Each straight base leg 471*a*, 471*b* is parallel to the other in an anterior/posterior direction. Each straight base leg 471*a*, 471*b* aligns perpendicular to corresponding attached rigid vertical component 3, and each straight base leg 471*a*, 471*b* is structurally and functionally identical to the other. As best seen in FIG. 5B, each straight base leg 471*a*, 471*b* has an inner leg edge 471*d* and an outer leg edge 471*e*. Each inner leg edge 471*d* comprises inner longitudinal leg ledge 400*f* with protruding ledge inner lip 471*ff*.

Referring to FIG. 5B, inner longitudinal leg ledge 400*f* is approximately three-quarters inch in height and perpendicular to lower base leg side 400*g*. Protruding ledge inner lip 471*ff* is approximately three-quarters inch in width and perpendicular to inner longitudinal leg ledge 400*f*. These features are identical to those of the preferred embodiment of FIG. 1. Protruding ledge inner lip 471*ff* and inner longitudinal leg ledge 400*f* is integrally part of and coextensive with straight base leg 471*a* or 471*b*.

Each protruding ledge inner lip 471*ff* comprises a first leg threaded aperture pair 402*a* and a second leg threaded aperture pair 402*b*. First leg threaded aperture pair 402*a* is positioned at anterior straight base leg end 400*h*, while second leg threaded aperture pair 402*b* is positioned at posterior straight base end 400*h*. Leg threaded aperture pairs 402*a*, 402*b* each comprise two smaller rounded threaded apertures 17*b*. Smaller round threaded apertures 17*b* reversibly receive threaded round screws 50*a* which attach straight base legs 471*a*, 471*b* to smaller partially elliptical apertures 17*a* (not seen in this view) of horizontal aperture pair 16*a* or 16*a*. These features are identical to those attachment features of the preferred embodiment in FIG. 1.

As best seen in FIG. 3 and FIG. 5B, outer leg edge 471*e* comprises upper outer leg wall 400*j*. Upper outer leg wall 400*j* is approximately four inches in height, and wall 400*j* protrudes upwardly and perpendicular to straight leg lowest side 400*g*. Upper outer leg wall 400*j* comprises two first and second wall aperture sets 400*k*, 400*kk*, and each wall aperture set 400*k*, 400*kk* containing four large partially elliptical apertures 17. Wall sets 400*k*, 400*kk* respectively each form a square at first and second straight base leg ends 400*h*, 400*hh* respectively for a total of eight large partially elliptical apertures 17.

Referring to FIGS. 2 and 3 of the preferred embodiment, upper outer leg wall 400*j* is co-extensive and integral with straight base leg 471*a* or 471*b*. Upper leg wall 400*j* contains upper leg wall ledge 400*jj*, and ledge 400*jj* protrudes in a perpendicular and interior direction to upper leg wall 400*j*. Each upper leg wall ledge 400*jj* is approximately three-quarters of an inch in width and comprises downward protruding interior side 400*q* as seen in FIG. 1. Downward protruding interior side 400*q* is approximately three-eighths inch in width.

Referring to FIG. 5B, each straight base leg lowest side 400*g* comprises first, second and third track sets 403*a*, 403*b*, and 403*c* respectively of small round track apertures 404 (generically track sets 403). Each track set 403 forms a square configuration of four small round track apertures 404. Each small round track aperture 404 is adapted to receive a small diameter round head screw 50*a* for attachment of a coaster or wheel 470*a*, 470*b* to straight leg lower track 400*g*. Each small round track aperture 404 is approximately one-quarter inch in diameter.

First track set 403*a* is aligned with remaining tracks sets 403*b*, 403*c*, and set 403*a* lies within straight base leg lowest side 400*g* at straight leg slanted anterior end 400*h*. Second track set 403*b* lies within straight base leg lowest side 400*g* at the longitudinal midpoint of each straight base leg 471*a*, 471*b*, and third track set 404*c* is located at straight leg posterior end 400*hh*.

Referring to FIGS. 1, 3 and 5B, each first straight leg anterior ends 400*h* of straight base legs 471*a*, 471*b* respectively comprise a first or second slanted lip 400*s*, 400*t* respectively. Each first or second slanted lip 400*s*, 400*t* respectively integrally attaches to corresponding first and second slanted outer edge 471*e*, 471*ee* respectively. Each slanted lip 400*s*, 400*t* comprises a trapezoidal shape which is: one inch in length on each lateral trapezoidal side, three inches in length on its upper trapezoidal side, and four inches on its lower trapezoidal side. Each slanted lip 400*s*, 400*t* protrudes downward and interiorly from slanted outer edges 471*e*, 471*ee* at an angle of approximately 70 degrees.

Each first and second vertical rigid component 3*a*, 3*aa* respectively, of first anterior rigid support structure 2*a*, attaches approximately three inches from corresponding straight leg anterior end 400*h* of first straight base leg 471*a* and second straight leg anterior end 400*h* of second straight base leg 471*b* respectively. Each first and second vertical rigid component 3*b*, 3*bb* respectively, of second rigid modular support structure 2*b*, is flush with corresponding posterior base leg end 400*hh* of first straight base leg 471*a* or corresponding posterior base leg end 400*h* of second straight base leg 471*b*.

Referring to FIGS. 1, 2 and 3, along lowest leg surface 400*p* of each straight base leg 471*a*, 471*b* are prior art first, second, third and fourth coasters or wheels 470*a*, 470*b*, 470*c*, 470*d* [generally coasters or wheels 470]. Coasters or wheels 470 mechanically attach to lowest leg surface 400*p* in a conventional manner at anterior straight base leg ends 400*h* and posterior straight base leg ends 400*hh*. With coasters or wheels 470, second modular mount rack frame 1 rolls easily along a flat horizontal supporting surface 480 such as a floor. Prior art locks 479 prevent second modular mount rack frame 1 from inadvertent movement. Round screws 50*b* with washers are preferred for wheel or coaster attachments 481 to straight track aperture track sets 403.

b. Second Embodiment of Second Modular Mount Rack Frame 1

Referring to FIGS. 4, 5A and 7, second embodiment of second modular mount frame 1 comprises (i) sole and only first anterior modular rigid support structure 2*a*; or (ii) sole and only first one posterior modular rigid support structure 2*b*; or other modular rigid support structure 2. In other embodiments there is vertical stacking of an uppermost additional modular rigid support structure 2*aa*, 2*bb* or 2 upon sole and single supporting modular rigid support structure 2.

Still referring to FIGS. 4 and 5A, removable first and second rack base legs 71*a*, 71*b* respectively substitute for straight base legs 471*a*, 471*b* of the preferred embodiment and other embodiments. Each first and second rack base leg 71*a*, 71*b* respectively preferably comprises first, second, third and fourth rack coasters or wheels 70*a*, 70*b*, 70*c*; 70*d* (generically rack coasters or wheels 70). Preferably prior art first and second rack coasters or wheels 70 attach to anterior and posterior rack base leg ends 71*aa*, 71*bb*, 71*cc*, 71*dd* respectively in a manner well known in the art.

Each rack coaster or wheel 70 comprises a corresponding prior art lock 79. Prior art locks 79 prevent second modular mount rack frame 1 from inadvertent swiveling along flat supporting surface 480. Each prior art wheel attachment 51*b* comprises small round apertures 51*bb* so each attachment 51*b* mechanically connects to first track set 403*a* by small round screws 50*b*.

Still referring to FIGS. 4 and 5A, one rack leg square set 900 penetrates each exterior upper slanted leg side 73*d* of each corresponding rack base leg 71*a*, 71*b* below each rack base leg maximum height 777. Each rack leg square set 900 comprises four rack large partially elliptical apertures 81*a*, 81*b*, 81*c*, 81*d* (generally rack large partially elliptical apertures 81] positioned within square configuration. Each rack large partially elliptical aperture 81 is identical in dimension and shape to large partially elliptical aperture 17.

Each rack large partially elliptical aperture 81's respective longitudinal length 10*e* is parallel to the corresponding longitudinal length of rack base legs 71*a*, 71*b*. Threaded bolts 50*x* attach respective rack base legs 71*a*, 71*b* to each congruently aligned vertical square set 18 through congruently aligned rack leg square sets 900. Other mechanical fasteners are satisfactory in alternative embodiments.

Each first and second rack base leg 71*a*, 71*b* respectively comprises interior flat lowest side 73*c*, exterior upper slanted side 73*d*, and rack base leg interior side 70*e*. Each rack base leg 71*a*, 71*b* is preferably approximately twenty inches in length in an anterior/posterior direction, and two and three-quarters inches in width. Each rack base leg 71*a*, 71*b* is approximately two and one-half inches in height where upwardly slanted side 73*d* attaches to each corresponding vertical component end 15*a* or 15*b*. Each exterior upper slanted side 73*d* is preferably approximately one and one-half inches in height at anterior leg end 71*aa*, 71*bb* and posterior leg end 71*cc*, 71*dd*.

Still referring to FIGS. 4 and 5A, flat interior lower side 73*c* is uniformly approximately three-quarters inch in height and comprises protruding ledge 73*t*. Protruding ledge 73*t* is perpendicular to flat lower side 73*c* and is approximately three-quarters inches in width. Protruding ledge 73*t* contains anterior and posterior threaded round apertures 778*a*, 778*b* respectively. Anterior and posterior threaded round apertures 778*a*, 778*b* are approximately two and one-quarter inches apart. Anterior threaded round aperture 778*a* is approximately six and one-quarter inch from anterior rack base leg end 71*aa* or 71*bb*. Threaded round apertures 778*a*, 778*b* congruently align with aperture pairs 16*a*, 16*b* for insertion of round screws 50*a*.

Each rack base leg 71*a*, 71*b* aligns perpendicular to corresponding attached modular rigid support structure 2*a* or 2*b*. Preferably each rack base leg 71*a*, 71*b* is structurally and functionally identical to the other. Each rack base leg 71*a*, 71*b* preferably consists of a single metal sheet which is approximately one-sixteenth inch in thickness. Each single metal sheet bends at a right angle to form lower rack base side 70*e*, as well as exterior and interior sides 73*c*, 73*d*.

Rack base legs 71*a*, 71*b* are preferred in embodiments in which (i) there is only a single first anterior modular rigid support structure 2*a*; or (ii) a single first posterior modular rigid support structure 2*b*. In this embodiment preferably each first and second rack base leg 71*a*, 71*b* respectively attaches to corresponding vertical rigid component end 15*a* approximately three inches posterior to corresponding anterior rack base leg end 71*aa*.

Third Embodiment and Fourth Embodiment a. Vertically Aligned Upper Modular Rigid Support Structures 2

Referring to FIG. 5B, the third embodiment of second mount rack frame 1 comprises first anterior modular rigid support structure 2*a*, first modular rigid support structure 2*b* and uppermost second posterior modular rigid support structure 2*bb*. First and second posterior modular rigid support structures 2*b*, 2*bb* respectively are vertically attached, so lower first modular rigid structure 2*b* supports upper second modular rigid support structure 2*bb*.

Because of modular design, in other embodiments second posterior modular rigid support structure 2*bb* can also function as, but not exclusively (i) first anterior modular support structure 2*a*; (ii) second anterior modular rigid support structure 2*aa*; (iii) first posterior modular rigid support structure 2*b*; or (iii) other modular rigid support structure 2. In the third embodiment, second posterior modular rigid support structure 2*bb* provides an upper modular unit which increases storage capacity without additional floor space.

Still referring to FIG. 5B, in the third embodiment first anterior modular rigid support structure 2*a* is approximately fifty-three inches in height; first posterior modular rigid support structure 2*b* is approximately thirty-nine inches in height; and second posterior modular rigid support structure 2*bb* is approximately seventeen and one-half inches in height. In other embodiments longitudinal vertical heights 10*b* of vertical rigid components 3 may vary as does depth of modular rigid support structures 2.

In other embodiments second mount rack frame 1 comprises vertically aligned first anterior modular rigid support structure 2*a*, second anterior modular rigid support structure 2*aa*, and first posterior modular rigid support structure 2*b*. In another permutation of a vertically modified second mount rack frame 1 (i) first anterior modular rigid support structure 2*a* attaches upper second anterior modular rigid support structure 2*aa*, while (ii) first posterior modular rigid support structure 2*b* attaches vertically aligned upper second posterior modular rigid support structure 2*bb*.

Attached modular rigid support structures 2*aa*, 2*bb* can be of diverse vertical heights but the effective lateral horizontal dimension 10*aa* of rigid horizontal components 4 is always nineteen inches. Each modular rigid support structure 2*aa*, 2*bb* is identical in structure and design to modular rigid support structures 2*a*, 2*b*, as well as other modular rigid support structures 2.

b. Rigid Flat Connecting Plates 90

Still referring to FIG. 5B, third embodiment of second mount rack frame 1 comprises first rigid flat connecting plate 90*a* and second rigid flat connecting plate 90*b* for additional mechanical stability and rigidity [generically rigid flat connecting plates 90]. Each rigid flat connecting plate 90 is preferably structurally and functionally identical to the other with the same length, width and thickness.

Preferably rigid flat connecting plates 90 are rectangular, but other shapes and dimensions are satisfactory in other embodiments.

Preferably each rigid flat connecting plate 90 is approximately six inches in length, four and five-eighths inches in width and one-sixteenth inch in thickness. Each rigid flat connecting plate 90 preferably comprises large partially elliptical plate apertures 92a, 92b, 92c, 92d, 92e, 92f, 92g and 92h (generically plate apertures 92). Plate apertures 92 form two linearly aligned sets of four apertures 92 at each adjacent first and second opposing plate edges 93a, 93b respectively: 92a, 92b, 92c, 92d respectively; and 92e, 92f, 92g, 92h respectively. However, other numbers and positions of plate apertures 92 are also satisfactory.

Preferably each plate aperture 92, as measured from each plate aperture center 92j, lies approximately five-eighths inch from the first or second corresponding longitudinal opposing plate edge 93a or 93b. Interior positioned plate apertures 92b, 92c are one and one-quarter inch apart from each other, as are interiorly positioned plate apertures 92f, 92g. Distal positioned plate apertures 92a, 92d and 92e, 92h are one and three-quarters inches from each other. Each plate aperture 92 is preferably identical to large partially elliptical aperture 17 in dimensions and shape.

Still referring to FIG. 5B, plate apertures 92 congruently align with corresponding horizontally aligned large partially elliptical apertures 17 within two square sets 18 with a lateral vertical component side 40d or 40dd. Congruently aligned large partially elliptical apertures 17 and plate apertures 92 thereby mechanically attach two adjoining rigid vertical components 3a, 3aa, 3b, 3bb, or other components 3 with bolts 50x, to form a stable continuous vertical structure.

Also as seen in FIG. 5B, horizontal aperture pairs 16 within upper positioned rigid horizontal component 4aa to congruently align with their spatial counterparts within lower rigid horizontal component 4a. One screw 50a inserts though each of congruently aligned horizontal aperture pairs 16a, 16b, 16c, 16d, and 16e within both rigid horizontal components 4a, 4aa to mechanically attach two vertically aligned modular rigid support structures 2 to each other.

Referring to FIG. 7, fourth embodiment of second mount rack frame 1 comprises first anterior modular rigid support structure 2a and upper vertically positioned second anterior modular rigid support structure 2aa. Attachment of flat rigid connecting plates 90a, 90b is identical in third and fourth embodiments, as well as in other embodiments. Attachment by congruently aligned horizontal aperture pair 16 and screws 50a is also identical in third and fourth embodiments, as well as in other embodiments.

Best Mode Assembly of One Modular Rigid Support Structure 2

In the best mode, the assembly of modular rigid support structures 2a, 2aa, 2b and 2bb is identical for other modular rigid support structures 2. For illustration purposes the following example primarily describes assembly of first anterior modular rigid support structure 2a.

Referring to FIG. 5C, the operator initially selects a first rigid vertical component 3a and a first rigid horizontal component 4a. He or she next inserts one vertical component end 15a of first rigid vertical component 3a within corresponding cutout segment 19c of first rigid horizontal component 4a. He or she then inserts one threaded bolt 50x through each of two congruently aligned horizontal large partially elliptical apertures 17 within each aperture pair 14aa/14a and 14b/14bb. This procedure attaches one vertical component end 15a to one horizontal component end 19a at location A.

The operator next inserts one end 15a of second rigid vertical component 3aa within corresponding cutout 19c of second horizontal component end 19b of first rigid horizontal component 4a. He or she congruently aligns each of two large partially elliptical apertures 17 of aperture pairs 14a/14aa and 14b/14bb in an identical manner to that described immediately supra. The operator inserts and tightens one threaded bolt 50x through each two congruently aligned large partially elliptical apertures 17 of horizontal and vertical aperture pair's 14a/14aa and 14b/14bb. This procedure attaches one vertical component end 15a to one horizontal component end 19b at location B.

The operator next inserts second vertical component end 15b within corresponding cutout segment 19c at rigid horizontal end 19b of second rigid horizontal component 4aa. He or she congruently aligns aperture pairs 14c/14cc and 14d/14dd as described previously for aperture pairs 14a/14aa and 14b/14bb. Threaded bolts 50x insert through aligned aperture pairs 14c/14cc, 14d/14dd to attach rigid vertical component 3aa to second rigid horizontal component 4aa at location C.

At location D, vertical aperture pairs 14cc, 14dd at vertical end 15b of rigid vertical component 3a congruently align with horizontal aperture pairs 14c, 14d respectively at horizontal end 19a of second rigid horizontal component 4aa. Threaded bolts 50x insert through aligned pairs 14c/14cc and 14d/14dd as previously described. Preferably all rigid vertical component ends 15a, 15b are identical to each other, and all rigid horizontal component ends 19a, 19b are identical to each other. In other modes rigid horizontal components 4a, 4aa and rigid vertical components 3a, 3aa interchangeably and reversibly assemble in a different chronological order.

Still referring to FIG. 5C, after assembly of one modular rigid support structure 2a, there are a total of sixteen large partially elliptical apertures 17: (i) eight large partially elliptical apertures 17 in an anterior orientation; and (ii) eight partially elliptical apertures 17 in a posterior orientation. In other embodiments rigid vertical components 3 and rigid horizontal components 4 assemble into other four-sided polygons, or other shapes, to form modular rigid support structure 2.

Assembly of Second Mount Rack Frame 1 a. Best Mode of Attaching Modular Rigid Support Structures 2a, 2b to First and Second Straight Base Legs 471a, 471b (1) Attachment of Vertical Components 3 to Straight Base Legs 471a, 471b Referring to FIGS. 3 and 5B, the operator initially selects one straight base leg 471a or 471b for attachment to rigid vertical component 3a or 3aa of completely assembled first anterior modular rigid support structures 2a. He or she congruently initially aligns (i) square aperture set 18b with (ii) corresponding square aperture set 400k within corresponding straight leg upwardly protruding wall 400j.

The operator inserts and tightens single threaded bolt 50x through each pair of congruently aligned large partially elliptical apertures 17 within (i) corresponding straight leg upwardly protruding wall 400j and (ii) square aperture set 18b within vertical lateral component side 40dd.

The operator follows the same procedure for attachment of rigid vertical component 3aa, 3b, 3bb or other rigid vertical component 3 to straight base leg 471a, 471b. This procedure includes insertion of bolts 50x through remaining three straight leg exterior square sets 400*k* and corresponding congruently aligned partial elliptical apertures 17 of remaining three aperture square sets 18.

Preferably straight base legs 471*a*, 471*b* are identical to and interchangeable with each other, so a different attachment chronology of attachment is also within the scope of the invention. After complete assembly of the preferred second modular mount rack frame 1, each straight base leg 471*a*, 471*b* is (i) parallel to the other. Each straight base leg 471*a*, 471*b* is also perpendicular to corresponding attached rigid vertical components 3.

(2) Attachment of Rigid Horizontal Components 4 to Straight Base Legs 471*a*, 471*b*

As best seen in FIG. 5B, each horizontal component end 19*a*, 19*b* attaches to a corresponding inner longitudinal leg ledge 400*f*. The operator congruently aligns (i) smaller partially elliptical apertures 17*a* within an outermost horizontal pair 16*a*, 16*e* within rigid horizontal component 4*a*, 4*a*, 4*b*, 4*bb*, or 4; with (ii) two threaded round apertures 17*b* within one corresponding inner longitudinal leg ledge 400*ff*.

The operator then inserts and tightens large one round threaded screw 50*a* through each congruently aligned smaller partially elliptical aperture 17*a* within horizontal pair 16*a* or 16*e*, and corresponding threaded round aperture 17*b*. The operator repeats this procedure for remaining congruently aligned outermost horizontal aperture pairs 16 and threaded round apertures 17*b* of inner longitudinal leg ledge 400*f*.

Each anterior surface 10*d* of rigid vertical component end 15*a* is positioned three inches from corresponding anterior straight base leg end 400*h* when corresponding anterior rigid vertical component 3*a*, 3*aa* is properly attached to straight base leg 471*a*, 471*b*. Each posterior vertical surface 10*dd* of rigid vertical component end 15*a* of posterior rigid vertical component 3*b*, 3*bb* is flush with corresponding posterior straight base leg end 400*hh*.

b. Attachment of Modular Rigid Support Structure 2 to Rack Base Legs 71*a*, 71*b* in the Best Mode Referring to FIG. 5A, each first and second rigid vertical component 3*a*, 3*aa*, 3*b*, 3*bb*, or 3 respectively attaches approximately six inches posterior to each corresponding first and second anterior rack base leg end 71*aa*, 71*bb* respectively. First, second, third and fourth partially large elliptical leg apertures 81*a*, 81*b*, 81*c*, 81*d* (generically rack large partially elliptical leg apertures 81) within each upwardly slanting rack leg wall 73*d*, respectively congruently align with square aperture pairs 18 of a corresponding vertical component end 15*a*.

Each two congruently aligned apertures 81/18 mechanically connects to each other by insertion of single threaded bolt 50*x*. In embodiments comprising a single modular rigid support structure 2 with rack base legs 71*a*, 71*b*, these bolts 50*x* provide attachment of rigid vertical components 3 to rack base legs 71*a*, 71*b*.

Horizontal rigid components 4 attach to rack base legs 71*a*, 71*b*, by horizontal aperture pairs 16*a* or 16*e* and corresponding ledge apertures 778*a*, 778*b*. Apertures 778*a*, 778*b* congruently align with small partially elliptical apertures 17*a* with aperture pair 16*a* or 16*e*. The operator then inserts and tightens one large screw 50*a* through apertures 778*a*/16*a*, 778*b*/16*a*; or 778*a*/16*e*, 778*b*/16*e*.

c. Attachment of Coasters or Wheels 70,470

Referring to FIGS. 2, 3 and 5B, prior art coasters or wheels 470 attach to lowest straight leg surface 400*p* at each anterior straight base leg end 400*h* or posterior base leg end 400*hh*. Prior art coasters or wheels 470 attach with well-known prior art devices 481 by four small round screws 50*g* to lowest straight leg surface 400*p* in a pivoting manner. Referring to FIG. 5A, rack coasters 70 attach to each rack base leg 71*a*, 71*b* at rack base ends 71 in a pivoting manner. Rack coasters or wheels 70 attach to base legs 71*a*, 71*b* by pivoting conventional prior art attachments 51*b* and mechanical fasteners 50*b* in a manner similar to that of straight base legs 471*a*, 471*b*.

Best Mode of Assembly of Second Mount Rack Frame 1 with Uppermost Modular Rigid Support Structure 2*b*

Referring to FIG. 5B, to attach one uppermost modular rigid support structure 2*bb*, the operator positions second posterior modular rigid support structure 2*bb* upon upper first rigid horizontal component 4*aa* of lower positioned first posterior modular rigid support structure 2*b*. Horizontal aperture pairs 16 within lower rigid horizontal component 4*a* of second posterior modular rigid support structure 2*bb* are now congruent with aperture pairs 16 within upper first rigid horizontal component 4*aa* of first posterior modular rigid support structure 2*b*. The operator inserts and tightens one large round threaded screw 50*a* through each pair of smaller partially elliptical aperture 17*a*/17*a* within each congruently aligned horizontal aperture pair 16 of adjoining rigid first and second horizontal components 4*a*, 4*aa*.

The operator next congruently aligns plate apertures 92 of flat rigid connector plates 90*a* with
(i) corresponding vertical aperture sets 18*a*/18*c* along
(ii) lateral vertical component sides 40*d* of rigid vertical components ends 15*a*, 15*b* of rigid vertical support components 3*bb*, 3*bb*
(iii) of first posterior modular rigid support structure 2*b* and upper second posterior modular rigid support structure 2*bb*.

The operator then inserts and tightens bolt 50*x* through each of the eight pairs of congruently aligned apertures 17/92. The operator repeats this identical procedure with second flat rigid connector plate 90*b* along rigid vertical component ends 15*a*, 15*b* of remaining rigid vertical components 3*bb*, and 3*bb*.

This identical procedure as described immediately supra, with rigid horizontal aperture pairs 16 and flat rigid connector plates 90, is also the best mode for upper vertical attachment of first anterior modular rigid support structure 2*a* to second anterior modular rigid support structure 2*aa* in another embodiment. Rigid horizontal components 4*a*, 4*aa* are preferably identical in structure and dimensions, so horizontal rigid components 4*a*, 4*aa* are reversible with respect to upper and lower vertical positions.

With respect to horizontal aperture pairs 16, the same attachment procedure with screws 50*a* remains the best mode for the preferred embodiment, as illustrated in FIG. 1. Although not required for the preferred embodiment, connector plates 90 are included within the best mode for upper vertical attachment of any modular rigid support structure 2 to another modular rigid support structure 2 in other embodiments.

Best Mode of Attaching Mounted Device 78 to Second Modular Mount Rack Frame 1 a. Anterior Two Opposing Point Attachment (1) Connecting Device 78 to Bracket 75

Referring to FIGS. 4 and 6, the operator congruently aligns mounting bracket 75 to first opposing device aperture pair 53*a* and 53*b*. He or she inserts and tightens single screw 50*g* through each corresponding congruently aligned device aperture 51*a* and bracket aperture 75*c*.

(2) Connecting Bracket 75 to Stamped Metal Strip 36*a*, 36*b*

The operator inserts two cage nuts 59 within two vertically adjacent corresponding rack apertures 8 of first or second stamped metal strip 36a, 36b. The operator inserts each cage nut 59, so each first and second cage nut flange 59a, 59b respectively protrudes anterior from each corresponding rack aperture 8.

The operator orients mounting bracket 75 so two bent bracket apertures 75e congruently align with corresponding cage nut apertures 59c within respective rack apertures 8. The operator next inserts and tightens Philips screw 50k through each corresponding congruently aligned rack apertures 8, bent segment aperture 75e, and cage nut aperture 59c. During this step the operator inserts Phillips screw 50k into cage nut aperture 59c through protruding cage nut flanges 59a, 59b.

The operator repeats this identical process on the second opposing device side 78b (not seen in FIG. 6), and thereby attaches second opposing side 78b to corresponding stamped metal strip 36a or 36b. The operator can orient mounting bracket bent end 75b for attachment through rack apertures 8 of posterior stamped metal strip 36b or anterior stamped metal strip 36a. To disengage mounted device 78, the operator removes each Phillips screw 50k from congruently aligned cage nut 59, rack aperture 8 and bent racket aperture 75e.

This prior art attachment as described for rigid vertical component 3a is the best mode for all other modular rigid support structures 2 and devices 78i. Other numbers of prior art bent bracket apertures 75e, with corresponding rack apertures 8 and prior art cage nuts 59, are also within the scope of the invention. In some embodiments mounting options also depend upon the design features of the manufacturer.

b. Four Opposing Point Attachment

Referring to FIGS. 2 and 6, the mechanics of attachment are identical to those for two point opposing point attachment with respect to anterior aperture pairs 53a and/or 53b. However, on each posterior opposing side segment 556, cage nut flanges 59a, 59c protrude posterior where device 78 attaches at opposing posterior device aperture pairs 53c, and so bend bracket end 75b also faces posterior.

Consequently mounted device 78, such as computer server 78t, attaches at
(i) First or second anterior device aperture pairs 53a or 53b respectively along the device's first and second opposing sides 78a, 78b respectively; and
(ii) Posterior device aperture pair 53c along the same device's first and second opposing sides 78a, 78b respectively,
for a total of eight attachment points.

Referring to FIG. 6, in the best mode each device aperture pair 53a, 53b, 53c and corresponding cage nuts 59 are positioned the same vertical distance along corresponding stamped metal strips 36a or 36b from flat supporting surface 480 when supporting single device 78t. In embodiments with at least two opposing modular rigid support structures 2, there is sufficient structure for solely anterior support (two point contact) or anterior-posterior support (four point contact).

For example, smaller mounted devices 78i can be supported at device anterior segment 555 with two point attachment by any modular rigid support structure 2, such as modular rigid support structures 2a, 2aa, 2b, 2bb. Similarly, larger mounted devices 78t can be supported at device posterior 556 by any modular rigid support structures 2 for four-point attachment. As seen in FIG. 4, in other embodiments, a sole and single modular rigid support structure 2 provides anterior two-point attachment.

Modification of Horizontal Dimension 10a Between Rigid Vertical Components 3

Figure 8B:
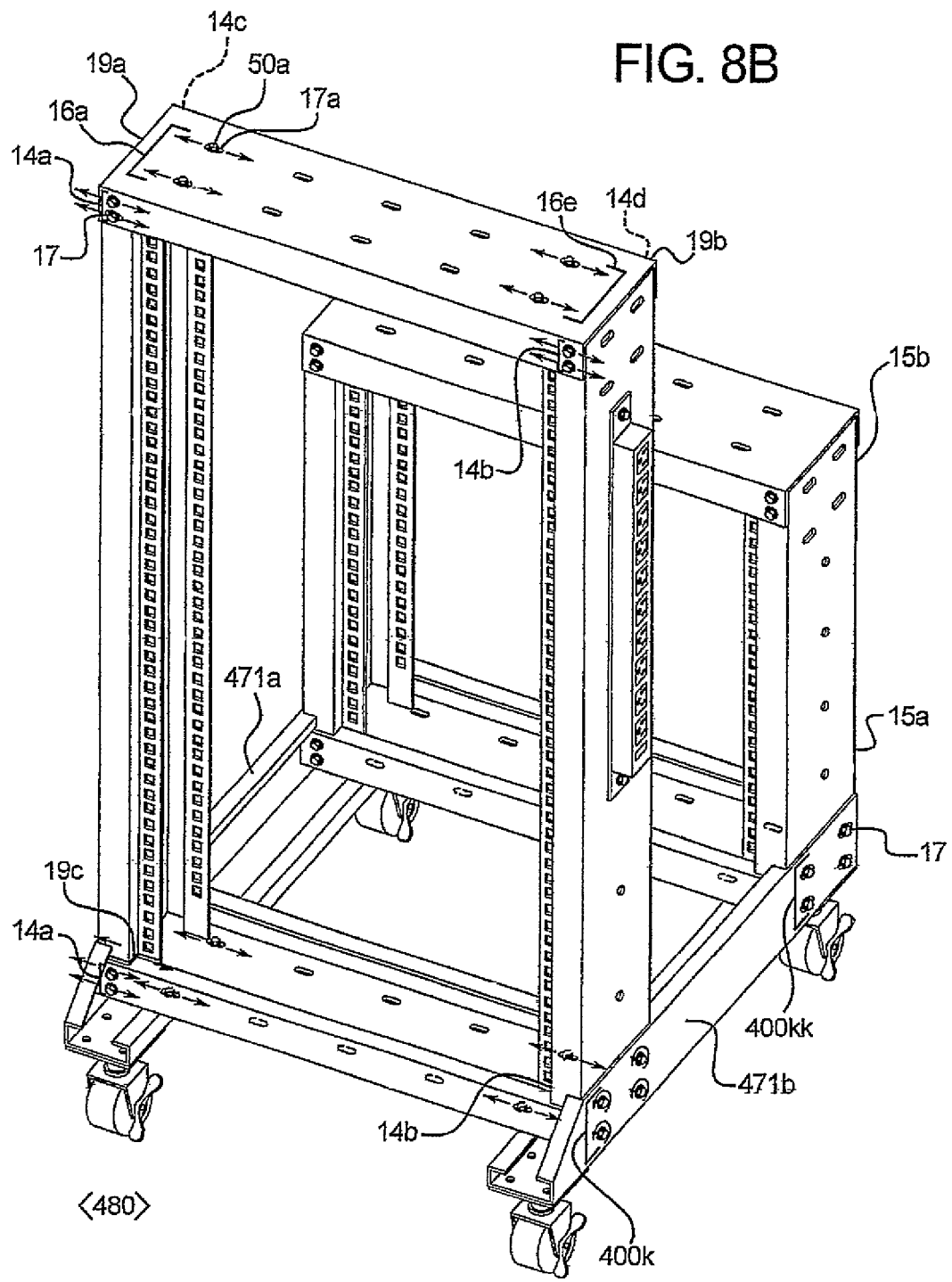
FIG. 8B is a partial anterior view of the preferred embodiment of FIG. 1 with bolts moved laterally.

In the pending invention there is one U unit of vertical height (i. e., one and three-quarter inches) for each subset 7 of three rack apertures 8. Referring now to FIGS. 8A and 8B, many mounted devices 78 deviate from the U industry standard of nineteen inches of horizontal length 10a. In addition, prior art brackets 75 often exhibit variations in thickness of bent segment 75b and flat segment 75d. These variations may interfere with precise fittings between rack apertures 8 and mounted device opposing sides 78a, 78b.

As seen in FIGS. 8a and 8B, the operator can adjust the effective horizontal length 10a between for example, two opposing rigid vertical components 3a, 3aa, or 3b, 3bb within a single modular rigid support structure 2a, 2b, 2bb. This same procedure is applicable to any other pair of opposing rigid vertical components 3 within single modular rigid support structure 2.

To adjust effective horizontal length 10a, the operator initially loosens each bolt 50x and connected hex nut (not seen) within congruently aligned vertical aperture pairs 14 and 14h within a single or two opposing rigid vertical components 3a, 3aa, 3b, 3bb or 3. The operator loosens Phillips screw 50a from each exterior positioned horizontal aperture pair 16a or 16e which congruently aligns with round threaded apertures 402a, 402b within corresponding attached straight base leg interior ledges 471ff.

Referring to FIG. 8A, preferably there is longitudinal clearance of approximately one-sixteenth inch on each side of each originally inserted bolt 50x or screw 50a. This clearance limits the distance each bolt 50x or large round screw 50a may move laterally to increase 1 effective distance 10a. The operator loosen bolts 50x and mated hex nuts inserted within each pair of (i) partially elliptical apertures 17 of aperture set 400k or 400kk; and (ii) partially elliptical apertures 17 of corresponding square aperture sets 18.

As best seen in FIG. 8B, the operator manually moves each rigid vertical component 3a/3aa, 3b/3bb, or 3/3 (depending upon the embodiment) laterally in an exterior direction within corresponding cutout segment(s) 19c. This lateral movement continues until each bolt 50x or large round screw 50a abuts outermost edge 14g of corresponding partially elliptical aperture 17 or 17a. The operator then tightens bolts 50x within lateral vertical aperture sets 18 and square aperture sets 400k and/or 400kk, as well as partially elliptical aperture pairs 14, 14h and 16.

To decrease effective horizontal length 10a the operator manually moves each rigid vertical component 3a, 3aa or 3b, 3bb (or both depending upon the embodiment) laterally inward within each cutout segment section 19c, and until each bolt 50x abuts innermost partially elliptical aperture edge 14f of corresponding partially elliptical apertures 17, 17a. For both inward and outward lateral adjustments, after positioning rigid vertical components such as 3a, 3aa, the operator tightens bolts 50x, hex nuts and Phillips screws 50a.

The same procedure for lateral adjustment applies to embodiments which (i) comprise vertically positioned rigid modular support structures such as 2aa or 2bb. In these embodiments vertically aligned modular rigid support structures 2 can be laterally adjusted together, or independently of one another. The same procedure for lateral adjustment also applies to embodiments of second modular mount rack frame 1 with sole and single rigid modular support structure 2.

Materials and Production of Second Mount Rack
Frame 1 in the Best Mode and Preferred
Embodiment Preferably rigid vertical components 3a, 3aa, 3b, 3bb and rigid horizontal components 4a, 4aa, 4b, 4bb are made of SPCC quality cold rolled steel. However, materials such as copper or other rigid materials are also satisfactory. Small round screws 50a, 50b, 50g, 50k, are preferably made of SPCC quality cold rolled steel, but materials such as copper or other rigid materials are also satisfactory. Straight base legs 471a, 471b and rack base legs 71a, 71b are preferably made of SPCC quality cold rolled steel, but copper or other rigid materials are also satisfactory. Bolts 50x and connected washers are preferably made of steel but other materials such as iron are also satisfactory.

Cold rolled steel is one of the widely used flat components used in constructing automobiles, home appliances, steel furniture and other equipment. Cold rolling is a well known prior art method of metal treatment wherein microscopic defects in the metal are nucleated throughout deformed area(s). Cold rolling increases the hardness and strength of a metal, but cold rolling also results in a large decrease in ductility.

Mechanical prior art attachments to wheels and coasters 470, 70 are preferably made of SPCC cold rolled steel, but copper or other rigid materials are also satisfactory. Cage nuts 59 and washers 50d are preferably made of SPCC quality cold rolled steel, but copper or other rigid materials are also satisfactory. Prior art connecting brackets 75 are preferably made of SPCC quality cold rolled steel, but copper or other rigid materials are also satisfactory.

Factory production of mount rack frame 1 components proceeds as follows:
(a) Mold production;
(b) Shear of steel sheets by numerically controlled computers;
(c) Punching of sheared plate sheets;
(d) Bending and folding of sheared metal plate sheets by numerically controlled computers; and
(e) Application of a surface finish which includes:
    (1) degreasing;
    (2) acid pickling;
    (3) rust prevention and parkerizing applications;
    (4) pure water cleaning; and
    (5) static electricity prevention plastic which is painted upon the metal surfaces.

The above text describes the preferred embodiment and other embodiments for the second mount rack frame 1, as well as the best mode of their applications. However, those skilled in this art may envision other possible variations within the invention's scope. Accordingly, since our invention is possible in other specific forms without departing from the sprit or essential characteristic thereof, the embodiments described herein are considered in all respects illustrative and not restrictive.

The invention claimed is:

1. A mount rack frame comprising a first rigid multi-component support structure, a second rigid multi-component support structure and a rack base,
   A. said rack base comprising a physically and structurally separate and distinct structure from said first rigid multi-component support structure and said second rigid multi-component support structure,
   said first rigid multi-component support structure and said second rigid multi-component support structure each comprising two rigid vertical components and two rigid horizontal components,
   said two rigid vertical components aligned parallel to and opposing each other, and said two rigid horizontal components being parallel to and opposing each other,
   each said rigid vertical component comprising a single vertical longitudinal length, and each said rigid horizontal component comprising a single horizontal longitudinal length,
   said rigid horizontal components and said rigid vertical components each being reversibly removable from each other and physically distinct and structurally separate from each other,
   said first rigid multi-component support structure and said second rigid multi-component support structure each reversibly attaching to said rack base simultaneously,
   said mount rack frame further comprising
   B. A first set of apertures and a first group of inserted mechanical fasteners reversibly vertically attaching and reversibly vertically aligning said first rigid multi-component support structure to a third multi-component rigid support structure,
   C. a second set of apertures and a second group of mechanical fasteners reversibly vertically attaching and reversibly vertically aligning said second rigid multi-component support structure to a fourth rigid multi-component support structure,
   D. A third set of apertures and a third group of mechanical fasteners reversibly attaching said rigid vertical components to said rigid horizontal components, and
   said third group of mechanical fasteners continuously adjusting a linear dimension solely within said third set of apertures, and
   E. A fourth set of apertures and a fourth group of mechanical fasteners,
   said fourth group of mechanical fasteners reversibly attaching said rigid vertical components to said rack base, and
   F. A fifth set of apertures and a fifth group of mechanical fasteners reversibly attaching mounted devices to said rigid vertical components,
   said fifth group of mechanical fasteners being the sole attachment of said mounted devices to said rigid vertical components,
   said rigid vertical components being reversibly interchangeable with each other, and
   said rigid horizontal components being reversibly interchangeable with each other.

2. The mount rack frame of claim 1 wherein
   said fourth group of mechanical fasteners reversibly attach connecting devices solely to said rigid vertical components, said connecting devices attaching said rigid vertical components to each other in vertical alignment,
   said connecting devices being separate and distinct components from said rigid vertical components and said rigid horizontal components and said rack base and said mechanical fasteners.

3. The mount rack frame of claim 1 wherein said fourth group of apertures comprises a first wall aperture set and a second wall aperture set within each said rigid vertical component, each said first wall aperture set and each said second wall aperture set comprising four individual apertures, and each said four individual apertures being configured as a square, and wherein each said corresponding fourth group of mechanical fasteners comprises bolts, said bolts reversibly attaching connecting devices to said rigid vertical components wherein said connecting devices do not comprise said mechanical fasteners.

4. The mount rack frame of claim 1 wherein each said rigid multi-component support structure functions independently without remaining said rigid multi-component support structures, and wherein each said rigid multi-component support structure reversibly and mechanically attaches to said rack base, said rigid multi-component support structures being reversibly interchangeable with each other.

5. The mount rack frame of claim 1 wherein said third set of apertures each comprise a plurality of individual apertures, said individual apertures each being partially elliptical in shape.

6. The mount rack frame of claim 1 wherein at least one said rigid multi-component support structure is greater in height than remaining said rigid multi-component support structures.

7. The mount rack frame of claim 1 wherein said mount rack frame is free standing without mechanical attachments or support from other surfaces or objects, and wherein said surfaces and said objects are not part of said mount rack frame.

8. The mount rack frame of claim 1 further comprising casters or wheels.

9. The mount rack frame of claim 1 wherein said rack base comprises two straight base legs and each said straight rack base leg comprises a first straight base leg end and a second straight base leg end, each said straight rack base leg being approximately thirty inches in longitudinal length, and two said rigid vertical components each attaching to said first straight base leg end and said second straight base leg end.

10. The mount rack frame of claim 1 wherein said rack base comprises a first straight rack base leg and a second straight rack base leg, each said straight rack base leg being approximately two and three-quarters inches in uniform width.

11. The mount rack frame of claim 1 not comprising shelves unless said shelves comprise said mounted devices.

12. The mount rack frame of claim 1 wherein each said rigid vertical component is approximately four and one-eight inches in lateral vertical side depth, said rigid vertical component being approximately two inches in anterior vertical width and said rack base comprising a first rack base leg and a second rack base leg, each said first and second rack base leg being approximately thirty inches in longitudinal length and two and three-quarters inches in width.

13. The mount rack frame of claim 1 wherein said first set of apertures, said second set of apertures and said third set of apertures each comprise aligned aperture pairs.

14. The mount rack frame of claim 1 wherein said third rigid multi-component support structure vertically attaches to a first group of additional rigid multi-component support structures and said fourth rigid multi-component support structure vertically attaches to a second group of additional rigid multi-component support structures.

15. The mount rack frame of claim 1 wherein said rack base comprises two rack base legs, and each said rack base leg being approximately thirty inches in anterior-posterior longitudinal length.

16. A mount rack frame comprising one rigid multi-component support structure, and a rack base, said rack base comprising two rack base legs, said rack base being structurally different from said multi-component support structure, said rack base reversibly attaching to said rigid multi-component support structure, said one multi-component support structure comprising two rigid vertical components and two rigid horizontal components, said rigid vertical components and said rigid horizontal components being reversibly removable from each other and physically separate and distinct from each other, each said rigid vertical component comprising a vertical longitudinal length and each said rigid horizontal component comprising a horizontal longitudinal length, said mount rack frame further comprising A. A first set of apertures and a first group of corresponding mechanical fasteners reversibly inserting within said first set of apertures, said first group of said mechanical fasteners comprising bolts, each said rigid vertical component attaching to one said rack base leg by four of said bolts, said four of said bolts being configured in a square, B. A second set of apertures positioned along said longitudinal length of each said rigid horizontal component, said second set of apertures containing a second group of corresponding mechanical fasteners, said second set of apertures comprising a first group of at least three aligned aperture pairs, said second group of mechanical fasteners reversibly and vertically attaching said one rigid multi-component support structure to another single multi-component support structure in vertical alignment, and C. A third set of apertures and a third group of mechanical fasteners, said third group of mechanical fasteners continuously adjusting a linear dimension solely within said third set of apertures without removal of said mechanical fasteners from said third set of apertures, said third set of apertures comprising a third group of aligned aperture pairs, said third group of said mechanical fasteners attaching said rigid horizontal components to said rigid vertical components, and D. A fourth set of apertures and a fourth group of inserted mechanical fasteners, said fourth group of said mechanical fasteners reversibly attaching mounted devices to said rigid vertical components, said mechanical fasteners being the sole support and attachment of said mounted devices to said mount rack frame, and said one rigid multi-component support structure functioning as a mount rack frame without remaining said another rigid multi-component support structure, and wherein said one rigid multi-component support structure or said another rigid multi-component support structure reversibly attaches to said rack base.

17. A mount rack frame comprising one rigid multi-component support structure, and a rack base,
said rack base comprising two rack base legs,
said rack base being structurally different from said multi-component support structure,
said rack base reversibly attaching to said rigid multi-component support structure,
said one multi-component support structure comprising two rigid vertical components and two rigid horizontal components,
said rigid vertical components and said rigid horizontal components being reversibly removable from each other and physically separate and distinct from each other,
each said rigid vertical component comprising a vertical longitudinal length and each said rigid horizontal component comprising a horizontal longitudinal length,
said mount rack frame further comprising
  B. A first set of apertures and a first group of corresponding mechanical fasteners reversibly inserting within said first set of apertures, said first group of said mechanical fasteners comprising bolts,
each said rigid vertical component attaching to one said rack base leg by four of said bolts, said four of said bolts being configured in a square,
  B. A second set of apertures positioned along said longitudinal length of each said rigid horizontal component, said second set of apertures containing a second group of corresponding mechanical fasteners,
said second set of apertures comprising a first group of at least three aligned aperture pairs,
said second group of mechanical fasteners reversibly and vertically attaching said one rigid multi-component support structure to another single multi-component support structure in vertical alignment, and
  C. A third set of apertures and a third group of mechanical fasteners,
said third group of mechanical fasteners continuously adjusting a linear dimension solely within said third set of apertures without removal of said mechanical fasteners from said third set of apertures,
said third set of apertures comprising a third group of aligned aperture pairs,
said third group of said mechanical fasteners attaching said rigid horizontal components to said rigid vertical components, and
  D. A fourth set of apertures and a fourth group of inserted mechanical fasteners,
said fourth group of said mechanical fasteners reversibly attaching mounted devices to said rigid vertical components,
said mechanical fasteners being the sole support and attachment of said mounted devices to said mount rack frame, and
said one rigid multi-component support structure functioning as a mount rack frame without remaining said another rigid multi-component support structure,
and wherein said one rigid multi-component support structure or said another rigid multi-component support structure reversibly attaches to said rack base, and
wherein said third set of apertures comprises individual apertures, and each said individual aperture is partially elliptical in shape.

18. A mount rack frame comprising one rigid multi-component support structure, and a rack base,
said rack base comprising two rack base legs,
said rack base being structurally different from said multi-component support structure,
said rack base reversibly attaching to said rigid multi-component support structure,
said one multi-component support structure comprising two rigid vertical components and two rigid horizontal components,
said rigid vertical components and said rigid horizontal components being reversibly removable from each other and physically separate and distinct from each other,
each said rigid vertical component comprising a vertical longitudinal length and each said rigid horizontal component comprising a horizontal longitudinal length,
said mount rack frame further comprising
  C. A first set of apertures and a first group of corresponding mechanical fasteners reversibly inserting within said first set of apertures, said first group of said mechanical fasteners comprising bolts,
each said rigid vertical component attaching to one said rack base leg by four of said bolts, said four of said bolts being configured in a square,
  B. A second set of apertures positioned along said longitudinal length of each said rigid horizontal component, said second set of apertures containing a second group of corresponding mechanical fasteners,
said second set of apertures comprising a first group of at least three aligned aperture pairs,
said second group of mechanical fasteners reversibly and vertically attaching said one rigid multi-component support structure to another single multi-component support structure in vertical alignment, and
  C. A third set of apertures and a third group of mechanical fasteners,
said third group of mechanical fasteners continuously adjusting a linear dimension solely within said third set of apertures without removal of said mechanical fasteners from said third set of apertures,
said third set of apertures comprising a third group of aligned aperture pairs,
said third group of said mechanical fasteners attaching said rigid horizontal components to said rigid vertical components, and
  D. A fourth set of apertures and a fourth group of inserted mechanical fasteners,
said fourth group of said mechanical fasteners reversibly attaching mounted devices to said rigid vertical components,
said mechanical fasteners being the sole support and attachment of said mounted devices to said mount rack frame, and
said one rigid multi-component support structure functioning as a mount rack frame without remaining said another rigid multi-component support structure, and
wherein said one rigid multi-component support structure or said another rigid multi-component support structure reversibly attaches to said rack base, and
wherein said rigid vertical components attach to said rack base with thick bolts and matching self-locking inserted hex nuts.

19. A mount rack frame comprising one rigid multi-component support structure, and a rack base,
said rack base comprising two rack base legs,
said rack base being structurally different from said multi-component support structure, said rack base reversibly attaching to said rigid multi-component support structure,
said one multi-component support structure comprising two rigid vertical components and two rigid horizontal components,
said rigid vertical components and said rigid horizontal components being reversibly removable from each other and physically separate and distinct from each other,
each said rigid vertical component comprising a vertical longitudinal length and each said rigid horizontal component comprising a horizontal longitudinal length,
said mount rack frame further comprising
  D. A first set of apertures and a first group of corresponding mechanical fasteners reversibly inserting within said first set of apertures, said first group of said mechanical fasteners comprising bolts,
each said rigid vertical component attaching to one said rack base leg by four of said bolts, said four of said bolts being configured in a square,
  B. A second set of apertures positioned along said longitudinal length of each said rigid horizontal component, said second set of apertures containing a second group of corresponding mechanical fasteners,
said second set of apertures comprising a first group of at least three aligned aperture pairs,
said second group of mechanical fasteners reversibly and vertically attaching said one rigid multi-component support structure to another single multi-component support structure in vertical alignment, and
  C. A third set of apertures and a third group of mechanical fasteners,
said third group of mechanical fasteners continuously adjusting a linear dimension solely within said third set of apertures without removal of said mechanical fasteners from said third set of apertures,
said third set of apertures comprising a third group of aligned aperture pairs,
said third group of said mechanical fasteners attaching said rigid horizontal components to said rigid vertical components, and
  D. A fourth set of apertures and a fourth group of inserted mechanical fasteners,
said fourth group of said mechanical fasteners reversibly attaching mounted devices to said rigid vertical components,
said mechanical fasteners being the sole support and attachment of said mounted devices to said mount rack frame, and
said one rigid multi-component support structure functioning as a mount rack frame without remaining said another rigid multi-component support structure,
and wherein said one rigid multi-component support structure or said another rigid multi-component support structure reversibly attaches to said rack base, and
wherein each said rack base leg is approximately twenty inches in longitudinal length and each rack base leg comprises an anterior end,
and each said rigid vertical component attaches approximately three inches from said anterior end.

20. A mount rack frame comprising one rigid multi-component support structure, and a rack base,
said rack base comprising two rack base legs,
said rack base being structurally different from said multi-component support structure,
said rack base reversibly attaching to said rigid multi-component support structure,
said one multi-component support structure comprising two rigid vertical components and two rigid horizontal components,
said rigid vertical components and said rigid horizontal components being reversibly removable from each other and physically separate and distinct from each other,
each said rigid vertical component comprising a vertical longitudinal length and each said rigid horizontal component comprising a horizontal longitudinal length,
said mount rack frame further comprising
  E. A first set of apertures and a first group of corresponding mechanical fasteners reversibly inserting within said first set of apertures, said first group of said mechanical fasteners comprising bolts,
each said rigid vertical component attaching to one said rack base leg by four of said bolts, said four of said bolts being configured in a square,
  B. A second set of apertures positioned along said longitudinal length of each said rigid horizontal component, said second set of apertures containing a second group of corresponding mechanical fasteners,
said second set of apertures comprising a first group of at least three aligned aperture pairs,
said second group of mechanical fasteners reversibly and vertically attaching said one rigid multi-component support structure to another single multi-component support structure in vertical alignment, and
  C. A third set of apertures and a third group of mechanical fasteners,
said third group of mechanical fasteners continuously adjusting a linear dimension solely within said third set of apertures without removal of said mechanical fasteners from said third set of apertures,
said third set of apertures comprising a third group of aligned aperture pairs,
said third group of said mechanical fasteners attaching said rigid horizontal components to said rigid vertical components, and
  D. A fourth set of apertures and a fourth group of inserted mechanical fasteners,
said fourth group of said mechanical fasteners reversibly attaching mounted devices to said rigid vertical components,
said mechanical fasteners being the sole support and attachment of said mounted devices to said mount rack frame, and
said one rigid multi-component support structure functioning as a mount rack frame without remaining said another rigid multi-component support structure,
and wherein said one rigid multi-component support structure or said another rigid multi-component support structure reversibly attaches to said rack base, and
said mount rack frame further comprising casters or wheels and not comprising shelves unless said shelves comprise said mounted devices.

21. A mount rack frame comprising multi-component modular rigid support structures,
said mount rack frame further comprising an anterior multi-component modular rigid support structure and a posterior multi-component rigid support structure of said multi-component modular rigid support structures,
said mount rack frame attaching to devices, each said device comprising anterior points and posterior points, said multi-component modular rigid support structures attaching to said devices by two point or four point attachments, said four point attachments attaching to said anterior points and said posterior points of said devices, said two point attachments attaching only to said anterior points of said devices, each said multi-component modular rigid support structure comprising rigid horizontal components, said rigid horizontal components being interchangeable with each other, each said multi-component modular rigid support structure comprising rigid vertical support components, said rigid vertical support components being interchangeable with each other, said multi-component rigid modular support structures each comprising openings within said rigid horizontal components for dimensional adjustments between their respective rigid vertical support components, said multi-component modular rigid support structures each further comprising pairs of partially elliptical apertures, said multi-component modular rigid support structures comprising bolts, said mount rack frame further comprising a rack base, said bolts being the sole and exclusive components for attaching said multi-component modular rigid support structures to said rack base, said rack base comprising an anterior end and a posterior end, said anterior multi-component modular rigid support structure attaching proximal to said anterior end of and said posterior multi-component modular rigid support structure attaching proximal to said posterior end, said anterior multi-component modular rigid support structure and said posterior multi-component modular rigid support structure each further comprising a vertical height, and said anterior multi-component rigid support structure or said posterior multi-component modular rigid support structure comprising a greater said vertical height than said remaining anterior multi-component rigid support structure or said remaining posterior multi-component modular rigid support structure, said mount rack frame being structurally adapted to increase storage space by vertical alignment of additional of said multi-component modular rigid support structures with said anterior multi-component rigid support structure and said posterior multi-component rigid support structure.

22. A mount rack frame comprising multi-component modular rigid support structures, said mount rack frame attaching to devices, each said device comprising anterior points and posterior points, said multi-component modular rigid support structures attaching to said devices by two point or four point attachments, said four point attachments attaching to said anterior points and said posterior points of said devices, said two point attachments attaching only to said anterior points of said devices, each said multi-component modular rigid support structure comprising rigid horizontal components, said rigid horizontal components being interchangeable with each other, each said multi-component modular rigid support structure comprising rigid vertical support components, said rigid vertical support components being interchangeable with each other, said multi-component modular rigid support structures each comprising openings within said rigid horizontal components for dimensional adjustments between their respective rigid vertical support components, said multi-component modular rigid support structures each further comprising pairs of partially elliptical apertures, said multi-component modular rigid support structures comprising bolts, said mount rack frame further comprising a rack base, said bolts being the sole and exclusive components for attaching said multi-component modular rigid support structures to said rack base, said rack base comprising an anterior end and a posterior end, said mount rack frame further comprising an anterior multi-component modular rigid support structure of said multi-component modular rigid support structures proximal to said corresponding anterior end of said rack base and a posterior multi-component modular rigid support structure of said multi-component modular rigid support structures proximal to said corresponding posterior end of said rack base, said anterior multi-component modular rigid support structure being vertically aligned with a first upper one of said multi-component modular rigid support structures, and said posterior multi-component modular rigid support structure being vertically aligned with a second upper one of said multi-component modular rigid support structures, each said anterior and posterior multi-component modular rigid support structure further comprising a vertical height, and each said first and second upper multi-component modular rigid support structure comprising a vertical height, said posterior multi-component modular rigid support structure or said anterior multi-component modular rigid support structure, together with each respective first or second upper multi-component modular rigid support structure, comprising a greater said vertical height than said remaining anterior or posterior multi-component modular rigid support structure together with said respective first or second upper multi-component modular rigid support structure, said mount rack frame being structurally adapted to increase storage space by vertical alignment of additional of said multi-component modular rigid support structures with the anterior and posterior multi-component rigid support structures respectively.

23. A mount rack frame comprising one rigid multi-component support structure, and a rack base, said rack base comprising two rack base legs, said rack base being structurally different from said multi-component support structure, said rack base reversibly attaching to said rigid multi-component support structure, said one multi-component support structure comprising two rigid vertical components and two rigid horizontal components, said rigid vertical components and said rigid horizontal components being reversibly removable from each other and physically separate and distinct from each other, each said rigid vertical component comprising a vertical longitudinal length and each said rigid horizontal component comprising a horizontal longitudinal length, said mount rack frame further comprising
- A. A first set of apertures and a first group of corresponding mechanical fasteners reversibly inserting within said first set of apertures, said first group of said mechanical fasteners comprising bolts, each said rigid vertical component attaching to one said rack base leg by four of said bolts, said four of said bolts being configured in a square,
- B. A second set of apertures positioned along said longitudinal length of each said rigid horizontal component, said second set of apertures containing a second group of corresponding mechanical fasteners, said second set of apertures comprising a first group of at least three aligned aperture pairs, said second group of mechanical fasteners reversibly and vertically attaching said one rigid multi-component support structure to another single multi-component support structure in vertical alignment, and
- C. A third set of apertures and a third group of mechanical fasteners, said third group of mechanical fasteners continuously adjusting a linear dimension solely within said third set of apertures without removal of said mechanical fasteners from said third set of apertures, said third set of apertures comprising a third group of aligned aperture pairs, said third group of said mechanical fasteners attaching said rigid horizontal components to said rigid vertical components, and
- D. A fourth set of apertures and a fourth group of inserted mechanical fasteners, said fourth group of said mechanical fasteners reversibly attaching mounted devices to said rigid vertical components, said mechanical fasteners being the sole support and attachment of said mounted devices to said mount rack frame, and said one rigid multi-component support structure functioning as a mount rack frame without remaining said another rigid multi-component support structure, and wherein said one rigid multi-component support structure or said another rigid multi-component support structure reversibly attaches to said rack base, and wherein each said rack base leg comprises a single rack base leg anterior end, and a single said rigid vertical component attaches to each of said single anterior end of a corresponding said rack base leg, and each said rack base leg is approximately twenty inches in longitudinal length and each said rigid vertical component attaches approximately three inches from a corresponding said rack base leg anterior end.

24. A mount rack frame comprising
(A) a rack base comprising rack base legs, each said rack base leg containing bolts in square configurations, said rack base legs each comprising a single and uniform height dimension in an anterior-posterior longitudinal direction, each said rack base leg comprising an anterior end and a posterior end, and
(B) an anterior multi-component anterior modular rigid support structure and a posterior multi-component posterior modular rigid support structure, each said multi-component modular rigid support structure comprising a separate and distinct mount rack frame when attached to said rack base, each said multi-component modular rigid support structure being interchangeable with the other, said anterior multi-component modular rigid support structure attaching proximal to said anterior end of said rack base legs and said posterior multi-component modular rigid support structure attaching to said posterior end of said rack base legs, each said multi-component modular rigid support structure comprising rigid vertical components and rigid horizontal components, said rigid vertical components attaching to said rigid horizontal components to form polygons, whereby said mount rack frame supports devices by two point and four point attachments, each said attachment physically connecting each said device to a corresponding said multi-component modular rigid support structure, each said rack base leg being reversibly attached to said multi-component modular rigid support structures exclusively by said bolts in square configurations, said mount rack frame structurally adapted to attach additional multi-component modular rigid support structures to said anterior multi-component modular rigid support structure and said posterior multi-component modular rigid support structure.

25. A mount rack frame comprising
(A) one single multi-component modular rigid support structure, said single multi-component modular rigid support structure being continuously polygonal, said single multi-component modular rigid support structure comprising rigid horizontal components and rigid vertical support components, said rigid horizontal components being reversibly separated from said rigid vertical components, and said rigid horizontal components being separate and distinct components from said rigid vertical components, and
(B) a rack base, said rack base comprising two rack base legs, said two rack base legs being the sole support of said mount rack frame, said mount rack frame not attaching to supporting structures exterior to said mount rack frame, said rack base legs comprising a longitudinal length, said longitudinal length of each said rack base leg being equivalent to one another, said rigid horizontal components each comprising at least four aligned aperture pairs, each of said aligned aperture pairs congruently aligning with another at least four aligned aperture pairs within another rigid horizontal component of another single rigid multi-component support structure, said congruently aligning aperture pairs each containing a single inserted corresponding mechanical fastener, said inserted corresponding mechanical fasteners reversibly attaching and reversibly aligning said single multi-component rigid support structure to said another said single rigid multi-component support structure, whereby Said mount rack frame increases in height and storage capacity by said vertical alignment of said another single multi-component rigid support structure upon said single multi-component rigid support structure, said vertical rigid components attaching to said rack base, said rigid vertical components comprising mechanical structural features for two-point attachment of stored devices,
said stored devices comprising lateral sides,
said stored devices attaching to said mechanical structural features for two point attachments along said lateral sides, said mechanical structural features for two point attachments comprising the sole attachment of said devices to said mount rack frame.

* * * * *